(12) United States Patent
Chen et al.

(10) Patent No.: US 9,490,295 B2
(45) Date of Patent: Nov. 8, 2016

(54) OPTOELECTRONIC DEVICE AND METHOD FOR MANUFACTURING THE SAME

(71) Applicant: EPISTAR CORPORATION, Hsinchu (TW)

(72) Inventors: Chao Hsing Chen, Hsinchu (TW); Jia Kuen Wang, Hsinchu (TW); Chien Fu Shen, Hsinchu (TW); Chun Teng Ko, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/716,262

(22) Filed: May 19, 2015

(65) Prior Publication Data

US 2015/0333241 A1   Nov. 19, 2015

(30) Foreign Application Priority Data

May 19, 2014   (TW) .............................. 103117570 A

(51) Int. Cl.
*H01L 33/00*    (2010.01)
*H01L 27/15*    (2006.01)
*H01L 33/64*    (2010.01)
*H01L 33/50*    (2010.01)
*H01L 33/60*    (2010.01)
*H01L 33/48*    (2010.01)
*H01L 33/62*    (2010.01)
*H01L 25/075*   (2006.01)

(52) U.S. Cl.
CPC .......... *H01L 27/156* (2013.01); *H01L 33/483* (2013.01); *H01L 33/50* (2013.01); *H01L 33/60* (2013.01); *H01L 33/644* (2013.01); *H01L 25/0753* (2013.01); *H01L 33/62* (2013.01); *H01L 33/64* (2013.01); *H01L 2224/32225* (2013.01); *H01L 2224/48091* (2013.01); *H01L 2224/48227* (2013.01); *H01L 2224/73265* (2013.01)

(58) Field of Classification Search
CPC ..... H01L 33/62; H01L 33/486; H01L 33/32; H01L 33/38; H01L 2924/01079
USPC .............................................. 257/82, 98, 99
See application file for complete search history.

(56) References Cited

U.S. PATENT DOCUMENTS

| | | |
|---|---|---|
| 6,630,689 B2 | 10/2003 | Bhat et al. |
| 6,891,197 B2 | 5/2005 | Bhat et al. |
| 7,221,044 B2 | 5/2007 | Fan et al. |
| 8,299,488 B2 | 10/2012 | Yang |
| 8,536,584 B2 | 9/2013 | Yao |
| 9,236,524 B2 * | 1/2016 | Jeon ........................ H01L 33/46 |
| 2013/0234192 A1 | 9/2013 | Kim et al. |

* cited by examiner

*Primary Examiner* — Quoc Hoang
(74) *Attorney, Agent, or Firm* — Patterson + Sheridan, LLP

(57) ABSTRACT

An optoelectronic device including a substrate having a first site, a second side opposite to the first side, and an outer boundary; a light emitting unit formed on the first side; a first electrode electrically connected to the light emitting unit; a second electrode electrically connected to the light emitting unit; and a heat dissipation pad formed between the first electrode and the second electrode and electrically insulated from the light emitting unit.

20 Claims, 28 Drawing Sheets

OPTOELECTRONIC DEVICE AND METHOD FOR MANUFACTURING THE SAME

REFERENCE TO RELATED APPLICATION

This present application claims the right of priority based on TW application Serial No. 103117570, filed on May 19, 2014, and the content of which is hereby incorporated by reference in its entirety.

TECHNICAL FIELD

The disclosure is related to an optoelectronic device, and more particularly, an optoelectronic device with a heat dissipation pad.

DESCRIPTION OF THE RELATED ART

The lighting theory of light-emitting diodes (LEDs) is that electrons move between n-type semiconductor and p-type semiconductor to release energy in the form of light. Due to the difference of lighting theories between LEDs and incandescent lamps, the LED is called "cold light source". An LED has the advantages of good environment tolerance, a long service life, portability, and low power consumption and is regarded as another option for the lighting application. LEDs are regarded as new generation lighting tools and widely adopted in different fields, for example, traffic lights, backlight modules, street lights, and medical devices and replace conventional light sources gradually.

FIG. 1 shows a schematic structure of a conventional light emitting device. As shown in FIG. 1, the conventional light emitting device 100 includes a transparent substrate 10, a semiconductor stack 12 on the transparent substrate 10, and one electrode 14 on the abovementioned semiconductor stack 12 wherein the semiconductor stack 12 includes a first conductivity type semiconductor layer 120, an active layer 122, and a second conductivity type semiconductor layer 124 disposed from the top to the bottom.

Additionally, the abovementioned light emitting device 100 can combine and connect with other device to form a light emitting apparatus. As shown in FIG. 2, a light emitting apparatus 200 includes a sub-mount 20 having one circuit 202, a solder 22 on the sub-mount 20 for mounting the light emitting device 100 on the sub-mount 20 and electrically connecting the light emitting device 100 with the circuit 202 of the sub-mount 20, and an electrical connecting structure 24 for electrically connecting with an electrode 14 of the light emitting device 100 and the circuit 202 of the sub-mount 20. The abovementioned sub-mount 20 can be a lead frame or mounting substrate with a large size and is beneficial to a circuit layout of the light emitting apparatus 200 and heat dissipation of the light emitting apparatus 200.

SUMMARY OF THE DISCLOSURE

An optoelectronic device including a substrate having a first side, a second side opposite to the first side, and an first outer boundary; a light emitting unit formed on the first side; a first electrode electrically connected to the light emitting unit; a second electrode electrically connected to the light emitting unit; and a heat dissipation pad formed between the first electrode and the second electrode and electrically insulating from the light emitting unit.

BRIEF DESCRIPTION OF THE DRAWING

The accompanying drawing is included to provide easy understanding of the present application, and is incorporated herein and constitutes a part of this specification. The drawing illustrates the embodiment of the present application and, together with the description, serves to illustrate the principles of the present application.

DETAILED DESCRIPTION OF THE EMBODIMENTS

Figure 1:
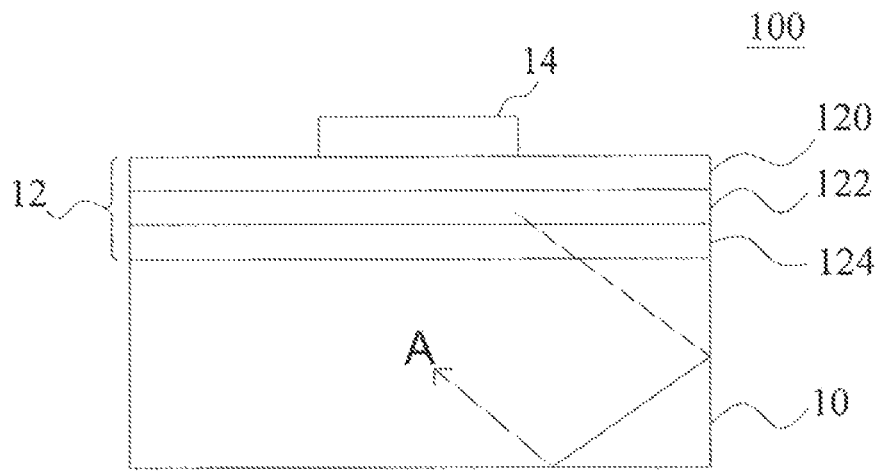
FIG. 1 shows a side view of a conventional optoelectronic device.
Figure 2:
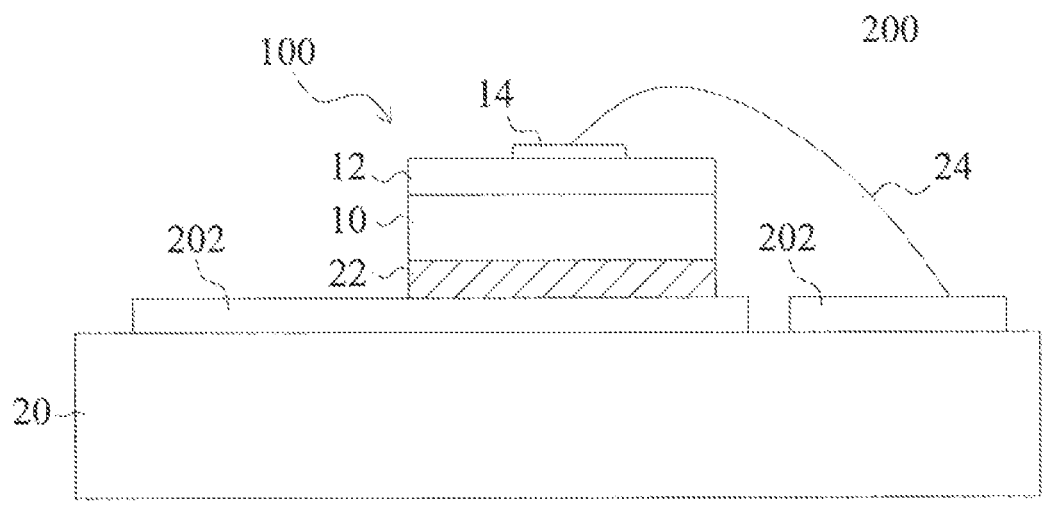
FIG. 2 shows a schematic view of a convention light emitting apparatus.

To better and concisely explain the present application, the same name or the same reference number given or appeared in different paragraphs or figures along the specification should has the same or equivalent meanings while it is once defined anywhere of the present application.

The following shows the description of embodiments of the present application in accordance with the drawing.

Figure 3A:
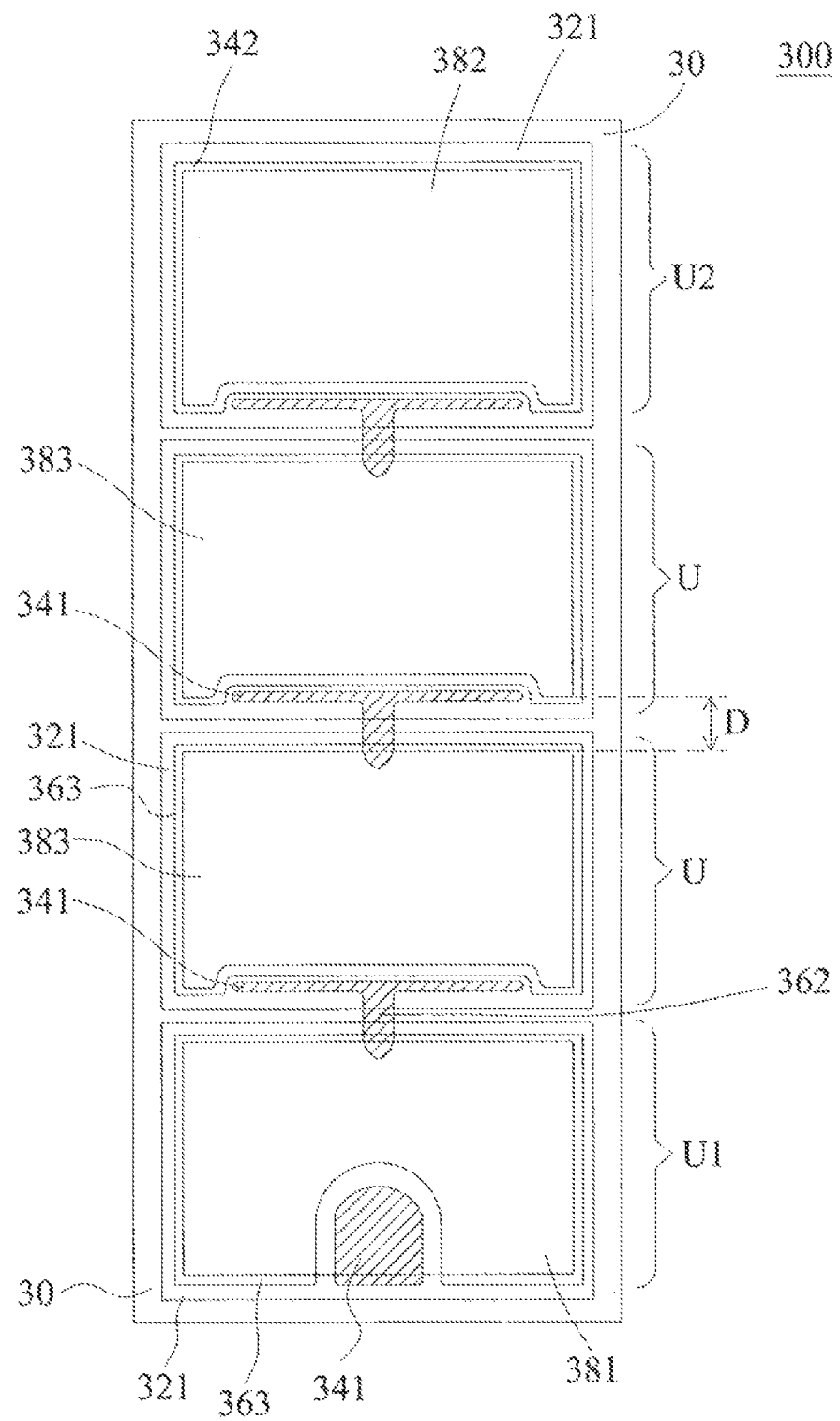
FIG. 3A shows a top view of an optoelectronic device in accordance with one embodiment of the present application.
Figure 3B:
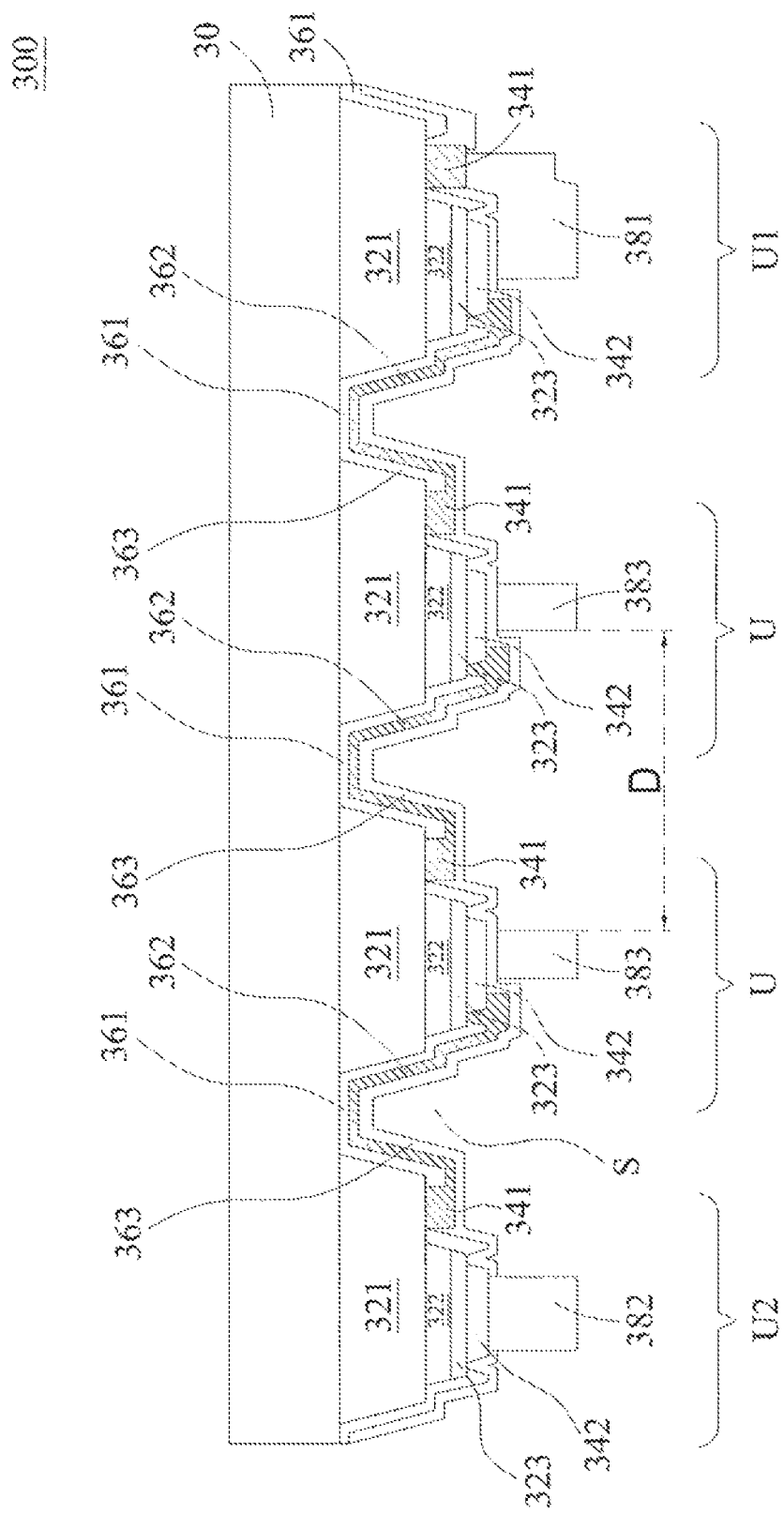
FIG. 3B and FIG. 3C show side views of an optoelectronic device in accordance with one embodiment of the present application.

FIG. 3A and FIG. 3B show a top view and a side view of an optoelectronic device in accordance with the first embodiment of the present application. The optoelectronic device 300 includes a substrate 30. A material of the substrate 30 is not limited to a single material, but the substrate 30 can be a composite substrate made of multiple different materials. For example, the substrate 30 can include a first substrate and a second substrate jointed with each other (not shown in the figures).

Afterwards, a plurality of arrayed optoelectronic units U, a first contact optoelectronic unit U1, and a second contact optoelectronic unit U2 are extendedly arranged on the substrate 30. Manufacturing methods of the arrayed optoelectronic units U, the first contact optoelectronic unit U1 and the second contact optoelectronic unit U2 are described below.

Firstly, in a conventional epitaxial growth process, an epitaxial stack is formed on a substrate 30 and includes a first semiconductor layer 321, an active layer 322, and a second semiconductor layer 323.

Next, as shown in FIG. 3B, a portion of the epitaxial stack is selectively removed by photolithography so that the plurality of optoelectronic units, the first contact optoelectronic unit U1, the second contact optoelectronic unit U2, and one trench S are formed and separately arranged on a growth substrate 30. In one embodiment, the trench S can be etched by photolithography so that each of the first semiconductor layers 321 of the plurality of optoelectronic unit U, the first contact optoelectronic unit U1, and the second contact optoelectronic U2 can have an exposed region served as a platform for the subsequent conductor arrangement formation.

In another embodiment, in order to increase efficiency of a whole device, the epitaxial stacks of the optoelectronic unit U, the first contact optoelectronic unit U1, and the second contact optoelectronic unit U2 can be disposed on the substrate 30 by transferring the epitaxial stacks or jointing the substrate and the epitaxial stacks. The epitaxial stacks of the optoelectronic unit U, the first contact optoelectronic unit U1, and the second contact optoelectronic unit U2 can be directly jointed with the substrate 30 by heating or pressuring, or the epitaxial stacks of the optoelectronic unit U, the first contact optoelectronic unit U1, and the second contact optoelectronic unit U2 can be adhered to the substrates 30 by a transparent adhesive layer (not shown in the figures). Herein, the material of the transparent adhesive layer can be an organic polymer transparent glue material, for example, polyimide, benzocyclobutane (BCB), prefluorocyclobutane (PFCB), epoxy, acrylic resin, PET, PC or a combination thereof; or a transparent conductive metal oxide, for example, ITO, InO, $SnO_2$, ZnO, FTO, ATO, CTO, AZO, GZO, or a combination thereof; or an inorganic insulating material, for example, $Al_2O_3$, SiNx, $SiO_2$, AlN, $TiO_2$, tantalum pentoxide ($Ta_2O_5$) or a combination thereof. In one embodiment, the abovementioned substrate 30 can include a wavelength conversion material.

In fact, the person skilled in the art shall understand that methods of deposing the epitaxial stacks of the optoelectronic unit U, the first contact optoelectronic unit U1, and the second contact optoelectronic unit U2 are not limited hereto. Additionally, in one embodiment, according to the times of transferring the substrate 30, a structure can be formed with its second semiconductor layer 323 next to the substrate 30, the first semiconductor layer 321 on the second semiconductor layer 323, and the active layer 32 between the first semiconductor layer 321 and the second semiconductor layer 323.

Subsequently, a first insulating layer 361 that can protect the epitaxial stacks and electrically insulate from the adjacent optoelectronic units U is formed on a partial surface of the epitaxial stacks of the first contact optoelectronic unit U1 and the second contact optoelectronic unit U2 and between the adjacent optoelectronic units U by chemical vapor deposition, physical vapor deposition or sputtering. Hereafter, a plurality of conductor arrangement structures 362 entirely isolated from one another is formed on surfaces of the first semiconductor layer 321 and the second semiconductor layer 323 of two of the adjacent optoelectronic units U by evaporating and sputtering. One end of each of those entirely isolated conductor arrangement structures 362 is distributed on the first semiconductor layer 321 along a single direction and the conductor arrangement structures 362 are electrically connected with one other through the first semiconductor layer 321. Those spatial isolated conductor arrangement structures 362 extend to the second semiconductor layer 323 of another one of the adjacent optoelectronic unit U and another end of the conductor arrangement structure 362 is electrically connected with the second semiconductor layer 323 of the optoelectronic unit U for electrically connecting the two adjacent optoelectronic units U in series.

The method of electrically connecting two of the adjacent optoelectronic units U is not limited hereto. The person skilled in the art shall understand that two ends of the conductor arrangement structure can be arranged in the same or different conductivity type semiconductor layers of different optoelectronic units U so as to electrically connect the optoelectronic units U in parallel or in series.

As shown in FIGS. 3A and 3B, a circuit layout of the optoelectronic device 300 is arranged as a series of arrays. First electrodes 341 are formed on the first semiconductor layers 321 of the optoelectronic unit U, the first contact optoelectronic unit U1, and the second contact optoelectronic unit U2, and second electrodes 342 are formed on the second semiconductor layers 323. Herein, the first electrode 341 and the second electrode 342 can be formed with the conductor arrangement structure 362 or they can be formed in separate processes. Additionally, materials of the first electrode 341 and the second electrode 342 can be respectively the same as or different from the material of the conductor arrangement structure 362. In one embodiment, the second electrode 342 can be a stacked structure and/or include a metal reflection layer (not shown in the figures) having reflectivity of more than 80%. In one embodiment, the conductor arrangement structure 362 can be a metal reflection layer having reflectivity of more than 80%.

As shown in FIG. 3B, a second insulating layer 363 can be formed on the plurality of conductor arrangement structures 362, a portion of the first insulating layer 361, and partial side walls of the epitaxial stacks. In one embodiment, the first insulating layer 361 and the second insulating layer 363 can be transparent layers and the materials of the first insulating layer 361 and the second insulating layer 363 can be oxide, nitride, or polymer, wherein the oxide can include $Al_2O_3$, $SiO_2$, $TiO_2$, tantalum pentoxide ($Ta_2O_5$) or $AlO_x$; the nitride can include AlN and SiN; the polymer can include polyimide, benzocyclobutane (BCB) or a combination thereof. In one embodiment, the second insulating layer 363 can be a distributed bragg reflector structure. In one embodiment, a thickness of the second insulating layer 363 is greater than a thickness of the first insulating layer 361.

Finally, a third electrode 381 is formed on the first electrode 341; a fourth electrode 382 is formed on the second electrode 342; and a first heat dissipation pad 383 is formed on the second semiconductor layer 323 of the optoelectronic unit U wherein the first heat dissipation pad 383 electrically insulates from the second semiconductor layer 323 of the optoelectronic unit U by the second insulating layer 363. In one embodiment, a projection of the first heat dissipation pad 383, vertical to the substrate 30, is not formed on the first insulating layer 361. In one embodiment, the first heat dissipation pad 383 is formed on a flat surface. As shown in FIG. 3A, each of the optoelectronic units U of the optoelectronic device 300 includes one of the first heat dissipation pads 383, and the first heat dissipation pad 383 electrically insulates from the second semiconductor layer 323 of the optoelectronic unit U through the second insulating layer 363.

In one embodiment, the third electrode 381, the fourth electrode 382, and the first heat dissipation pad 383 can be formed in the same process or in different processes. In one embodiment, the third electrode 381, the fourth electrode 382, and the first heat dissipation pad 383 can individually include an identical stacked structure. In order to achieve a predetermined conductivity, materials of the first electrode 341, the second electrode 342, the conductor arrangement structure 362, the third electrode 381, the fourth electrode 382, and the first heat dissipation pad 383 can be metal, for example, Au, Ag, Cu, Cr, Al, Pt, Ni, TI, Sn, an alloy thereof or a stack combination thereof.

In one embodiment, the second semiconductor layer 323 includes a top surface having a first surface area, the first heat dissipation pad 383 has a second surface area, and a ratio of the second surface area to the first surface area is between 80%~100%. In one embodiment, there is a shortest distance D between boundaries of any two of the first heat dissipation pads 383 and/or the shortest distance L) is greater than 100 μm.

Figure 3C:
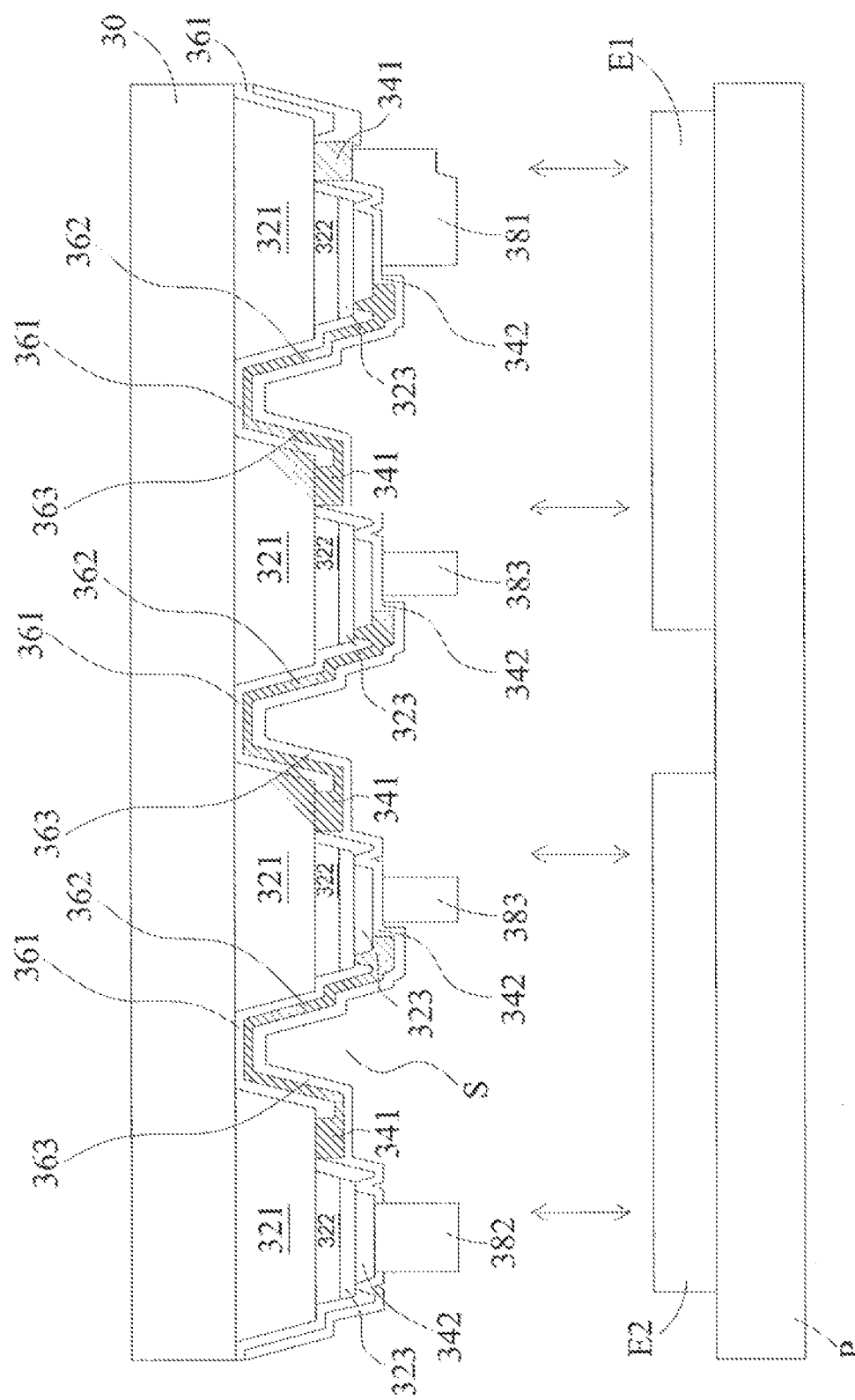

As shown in FIG. 3C, a carrier plate or a circuit device P is provided and a first carrier electrode E1 and a second carrier electrode E2 are formed on the carrier plate or the circuit device P by wiring or soldering. The first carrier electrode E1, the second carrier electrode E2, and the third electrode 381 and the fourth electrode 382 of the optoelectronic device 300 form a flip chip structure.

In one embodiment, the first carrier electrode E1 can be electrically connected with the third electrodes 381 and one of the first heat dissipation pads 383 of the optoelectronic device 300, the second carrier electrode E2 can be electrically connected with the fourth electrode 382 and another one of the heat dissipation pads 383, and a flip chip structure is formed accordingly. The first heat dissipation pads 383 can help dissipate heat, since the first heat dissipation pads 383 are electrically connected with the first carrier electrode E1 and the second carrier electrode E2. In the embodiment, there is a voltage difference while operating each of the optoelectronic units U, arranged as a series of arrays, of the optoelectronic device 300. By electrically insulating the first heat dissipation pads 383 from the optoelectronic units U, a breakdown or a current leakage due to the abovementioned voltage difference while operating can be avoided. Additionally, a projection of the first heat dissipation pad 383, vertical to a surface of the substrate 30, is not formed on the first insulating layer 361 to avoid disconnection due to a difference of height of the trench S, and a current leakage or a short circuit resulted from incompletely electrically insulating the first insulating layer 361 from the current.

FIG. 4A through FIG. 4E show top views of an optoelectronic unit in accordance with another embodiment of the present application. FIG. 4A through FIG. 4E show possible variants of the first embodiment of the present application. Manufacturing method, materials, and labels in the present embodiments are the same as that of the first embodiment and the descriptions of those are omitted herein.

Figure 4A:
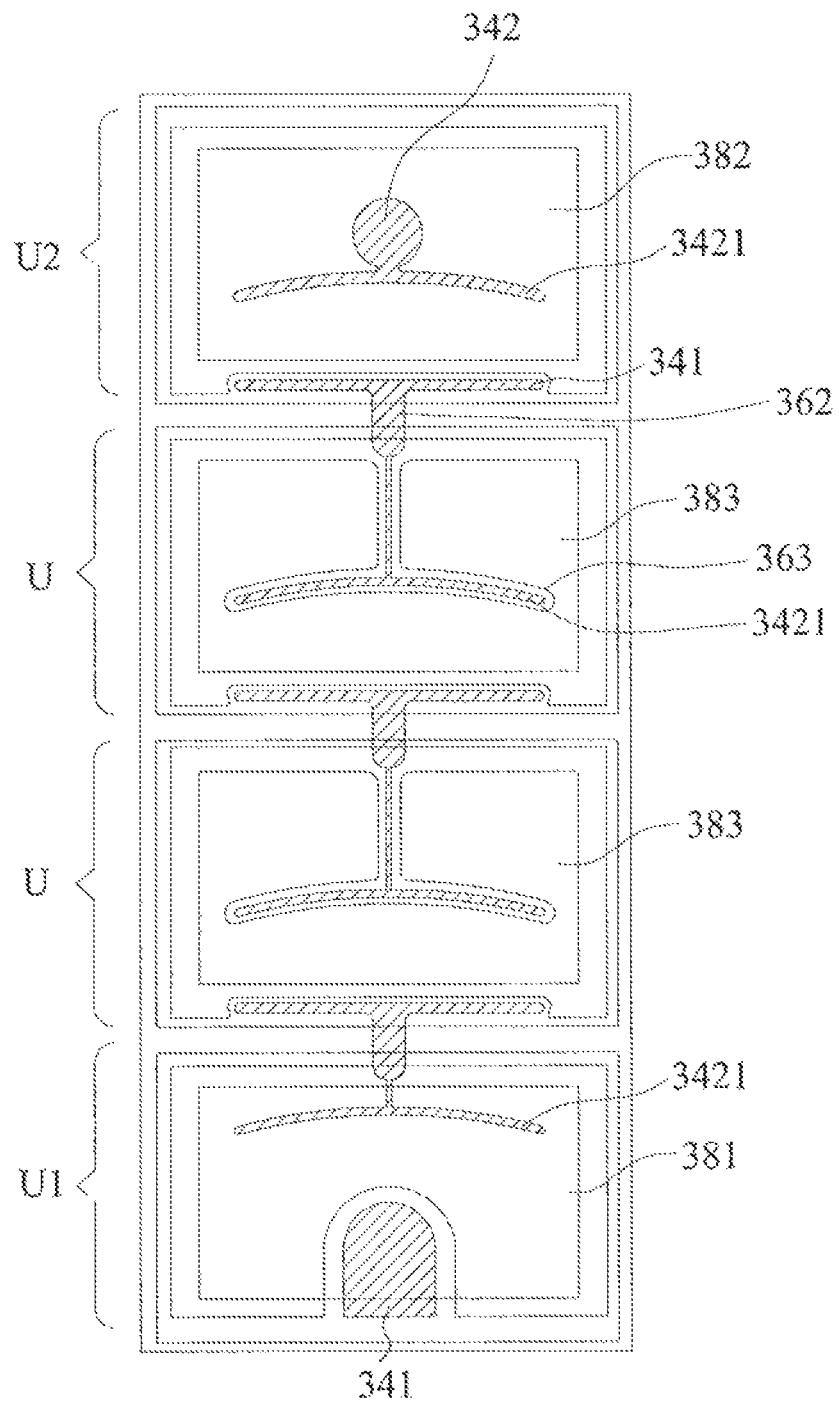
FIG. 4A to FIG. 4E show top views of an optoelectronic device in accordance with another embodiments of the present application.

As shown in FIG. 4A, each of the optoelectronic units LI, the first contact optoelectronic unit U1, and the second contact optoelectronic unit U2 can be connected as a line. In the embodiment, the first electrodes 341 or the second electrodes 342 of each of the optoelectronic units U, the first contact optoelectronic unit U1, and the second contact optoelectronic unit U2 can include extension electrodes 3421 for current spreading over each of the optoelectronic units U, the first contact optoelectronic unit U1 and the second contact optoelectronic unit U2. One skilled in the art shall understand a shape of the extension electrode can be adjusted by request of design but is not limited by the present figures. Additionally, the first heat dissipation pads 383 formed on the optoelectronic units U can be adjusted based on the shape of the extension electrodes 3421 so that the heat dissipation pads 383 do not directly contact the conductor arrangement structure 362, the first electrode 341 or the second electrode 342 and are therefore electrically insulated from them.

Figure 4B:
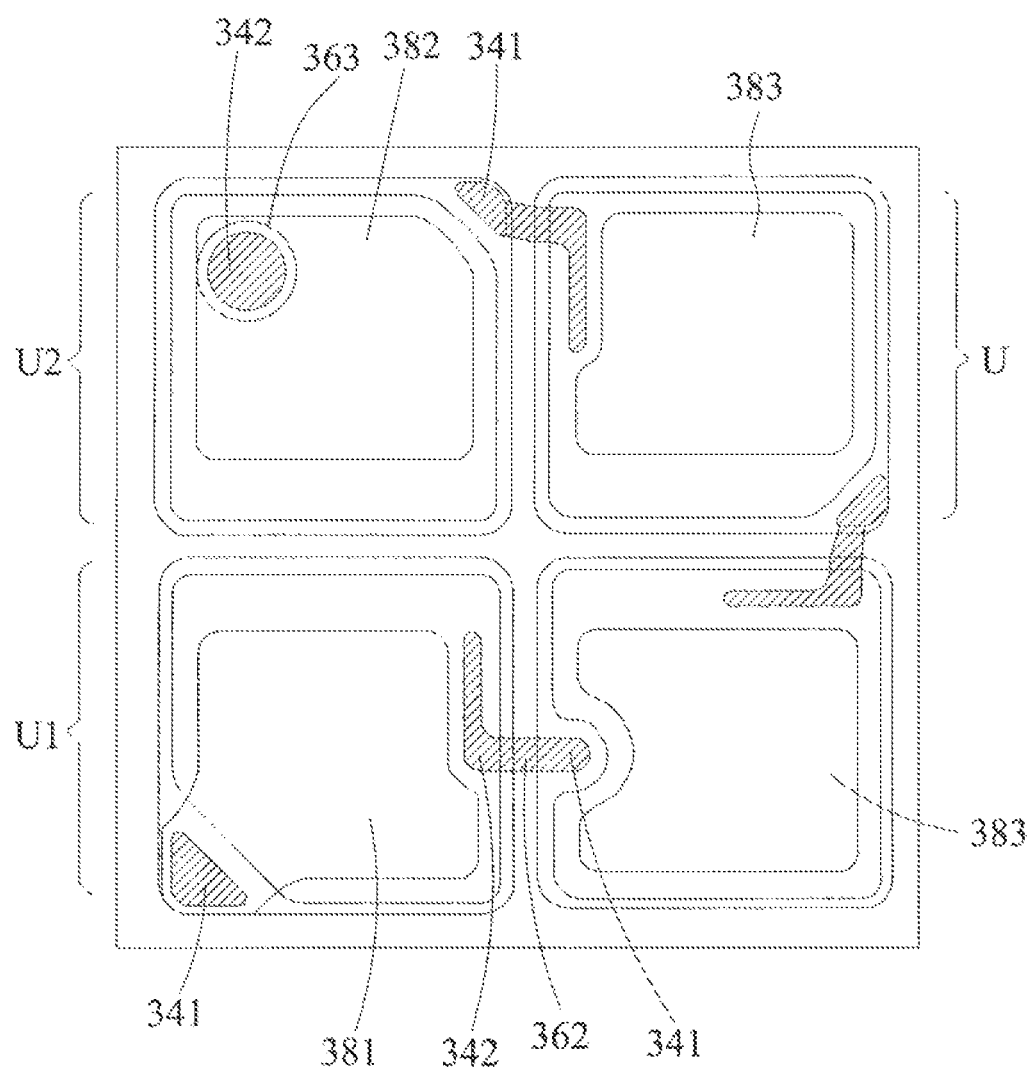

FIG. 4B shows another variant of the present application. In the application, each of the optoelectronic units U, the first contact optoelectronic unit U1, and the second contact optoelectronic unit U2 are connected as a ring rather than a line. Herein, one side wall of the first contact optoelectronic unit U1 is connected with a side wall of the second contact optoelectronic unit U2 Additionally, the first heat dissipation pads 383 formed on the optoelectronic units U can be adjusted based on the shapes of the extension electrodes 3421 so that the heat dissipation pads 383 do not directly contact the conductor arrangement structures 362, the first electrode 341 or the second electrode 342 and are therefore electrically insulated from them.

Figure 4C:
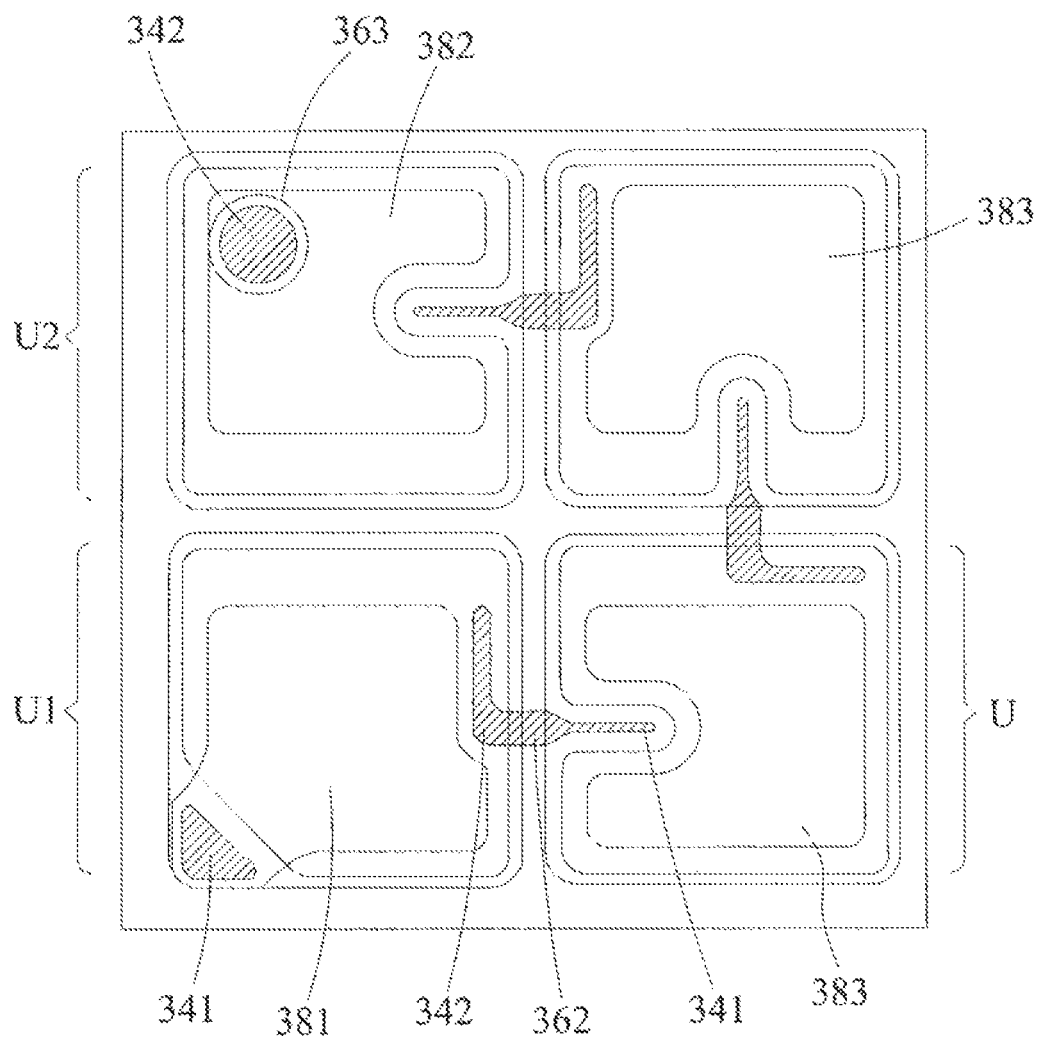

FIG. 4C shows another variant of the present application. In the application, each of the optoelectronic units U, the first contact optoelectronic unit U1, and the second contact optoelectronic unit U2 can be connected as a ring. Except the first contact optoelectronic unit U, a width of the first electrode 341 of each of the optoelectronic units U and a width of the first electrode 341 of the second contact optoelectronic unit U2 are smaller than a width of the conductor arrangement structure 362, and the first electrode 341 extends toward an inner part of each of the units for current dispreading. Additionally, the first heat dissipation pads 383 formed on the optoelectronic units U can be adjusted based on the shapes of the conductor arrangement structure 362, the first electrode 341, or the second electrode 342 so that the heat dissipation pads 383 do not directly contact the conductor arrangement structures 362, the first electrode 341 or the second electrode 342 and are therefore electrically insulated from them.

Figure 4D:
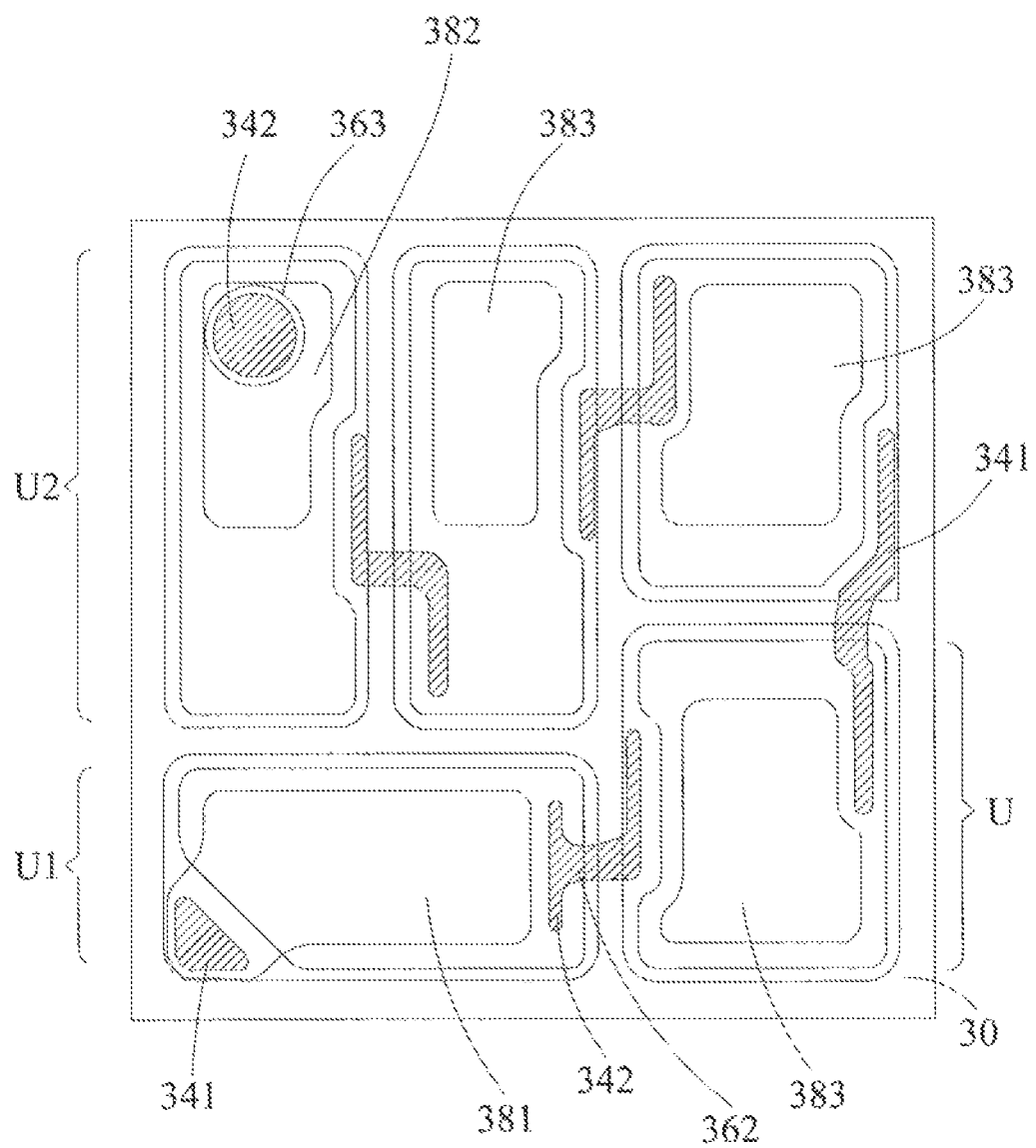

FIG. 4D shows another variant of the present application. In the embodiment, each of the optoelectronic unit U, the first contact optoelectronic unit U1, and the second contact optoelectronic unit U2 can be connected as a ring, and shapes of each of the optoelectronic units U, the first contact optoelectronic unit U1, and the second contact optoelectronic unit U2 can be changed by request of design and are not completely identical with one another. In the embodiment, the optoelectronic units U include three kinds of shapes. One skilled in the art shall understand the number, shapes, sizes, and the arrangement of the optoelectronic units U can be adjusted according to the desired driving current. Additionally, the first heat dissipation pads 383 formed on the optoelectronic units U can be adjusted based on shapes of the conductor arrangement structure 362, the first electrode 341, or the second electrode 342 so that the heat dissipation pads 383 do not directly contact the conductor arrangement structures 362, the first electrode 341 or the second electrode 342 and are therefore electrically insulated from them.

Figure 4E:
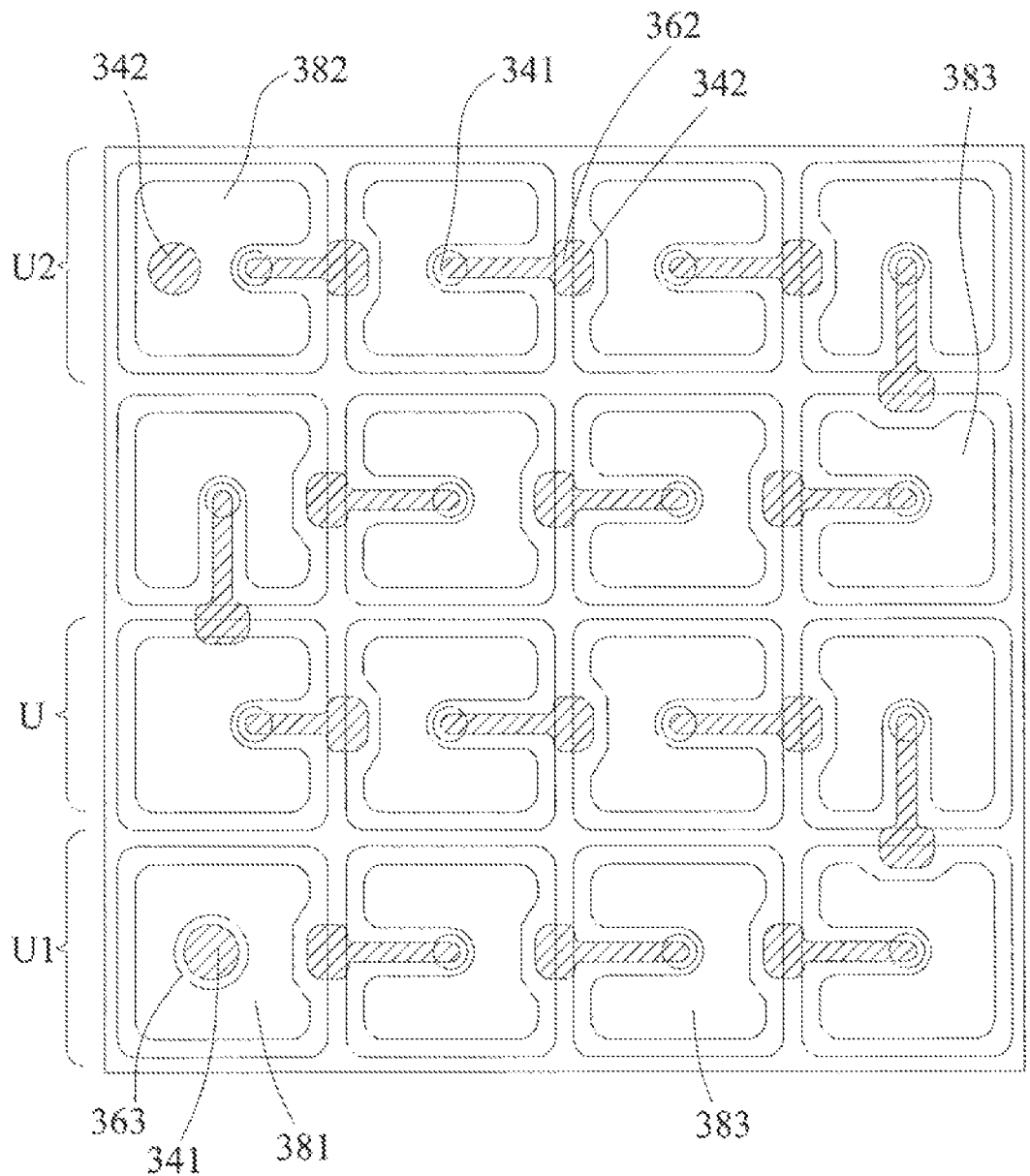

FIG. 4E shows another variant of the present application. In the embodiment, each of the optoelectronic units U, the first contact optoelectronic unit U1, and the second contact optoelectronic unit U2 can be connected as a zigzag, which means the connecting directions of two of the adjacent the optoelectronic units U in different rows are different. Furthermore, a 4×4 matrix is formed. One skilled in the art shall understand that the number or the arrangement of the optoelectronic units U is designed by the desired driving current. In the present embodiment, by connecting the units as a spiral, the first contact optoelectronic unit U1 and the second contact optoelectronic unit U2 can be formed in the same column. Because the positions of the first contact optoelectronic unit U1 and the second contact optoelectronic unit U2 are for connection with an external circuit, another embodiment, the arrangement of the optoelectronic units U can be adjusted so that the first contact optoelectronic unit U1 and the second contact optoelectronic unit U2 can be disposed at two ends of a diagonal line of the matrix. Additionally, the first heat dissipation pads 383 formed on the optoelectronic units U can be adjusted based on the shapes of the conductor arrangement structure 362, the first electrode 341, or the second electrode 342 so that the heat dissipation pads 383 do not directly contact the conductor arrangement structures 362, the first electrode 341 or the second electrode 342 and are therefore electrically insulated from them.

Figure 5A:
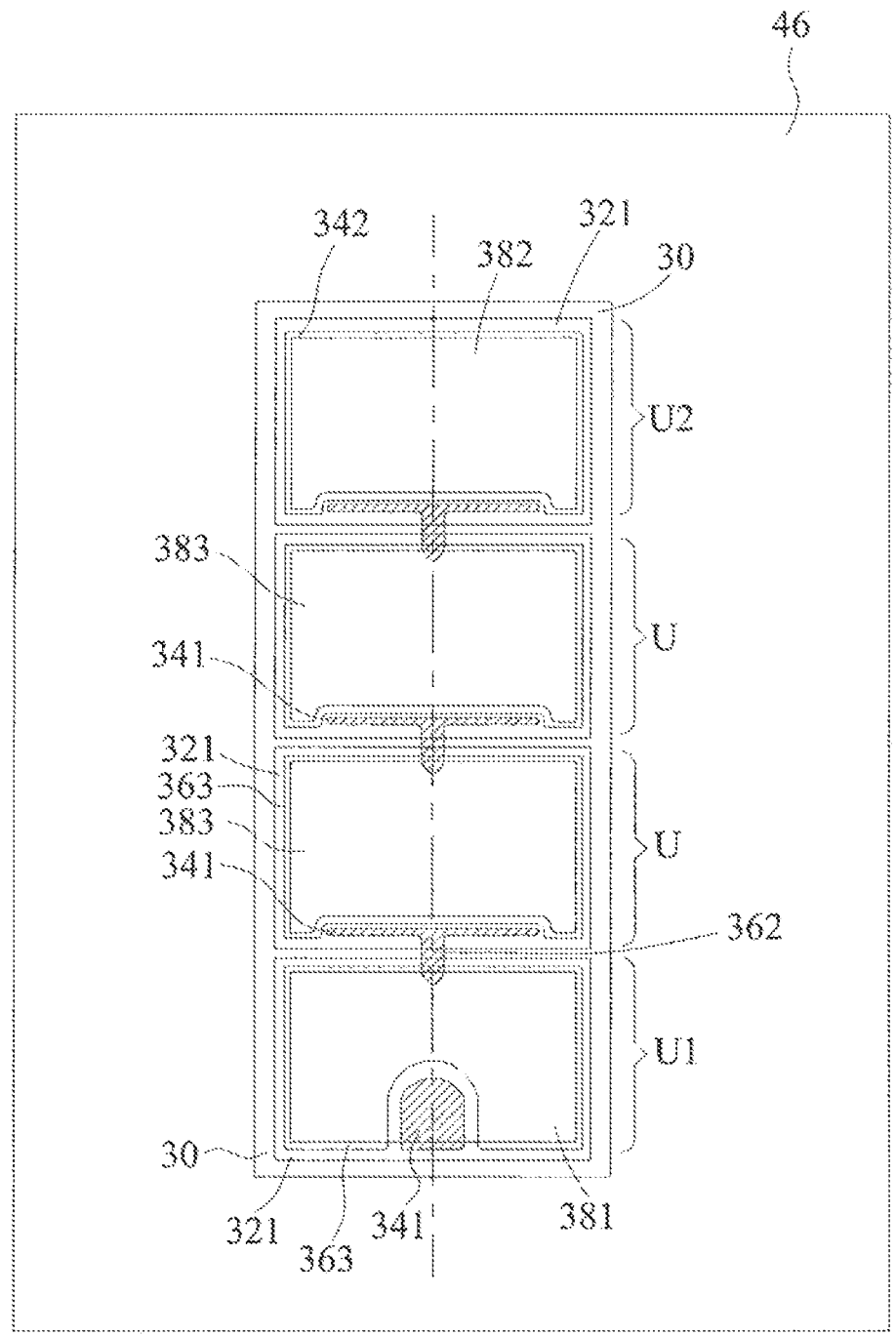
FIG. 5A shows a top view of an optoelectronic device in accordance with another embodiment of the present application.
Figure 5B:
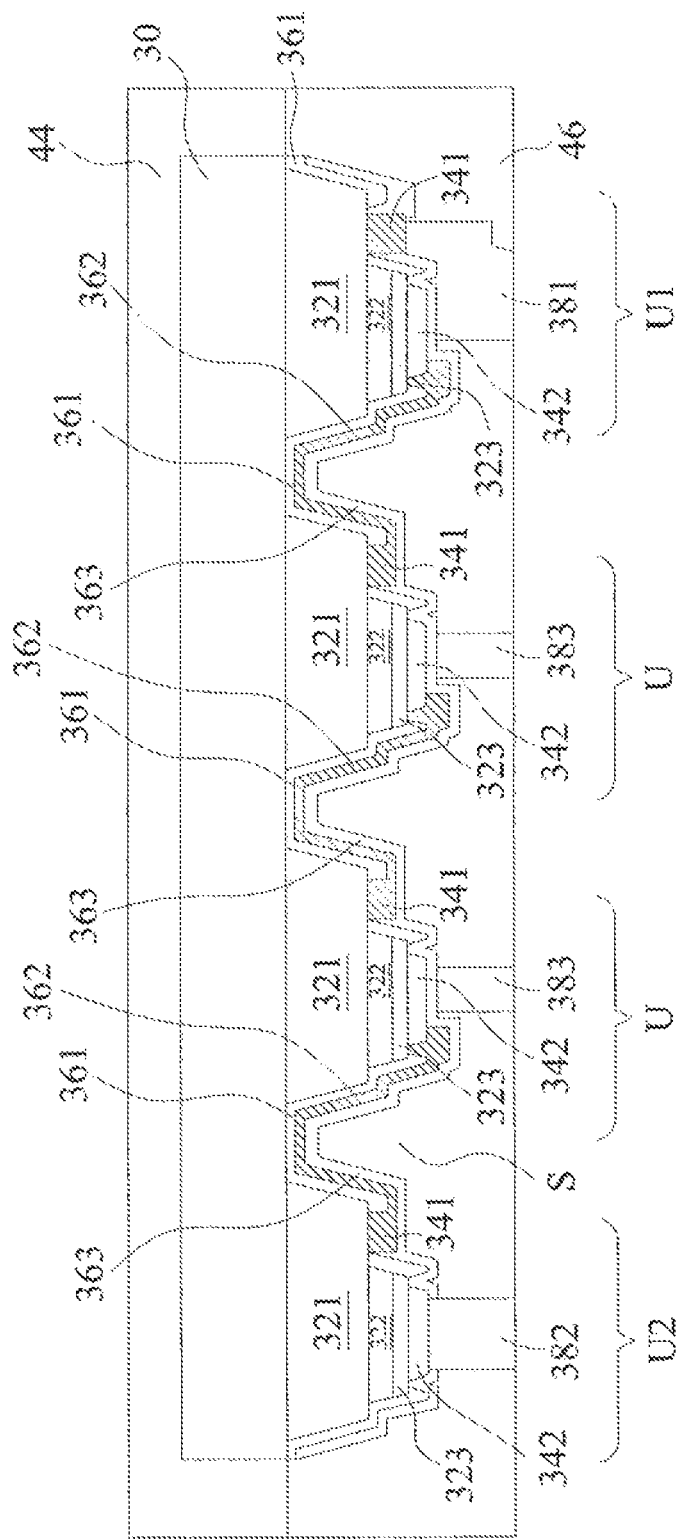
FIG. 5B shows a side view of an optoelectronic device in accordance with one embodiment of the present application.

FIG. 5A through FIG. 5E show side views and top views of a manufacturing process of an optoelectronic device in accordance with the second embodiment of the present application. Herein, FIG. 5A and FIG. 5B are subsequent to steps shown in FIG. 3A and FIG. 3B. The manufacturing method, the materials, and the labels in the present embodiment are the same as that of the first embodiment, and descriptions thereof are omitted herein. In the top view of the present embodiment, in order to clarify the differences between the present embodiment and the first embodiment, some elements are omitted herein and one skilled in the art shall adequately understand the present embodiment by referring to the aforementioned embodiment.

As shown ire FIG. SA and FIG. 5B, a supporting device 44 can be formed on the substrate 30 and cover a side wall of the substrate 30. In one embodiment, the supporting device 44 can be transparent and a material of the supporting device 44 can be silicone resin, epoxy resin, or other material. In one embodiment, a light guiding device (not show in figures) can be formed on the supporting device 44. A material of the light guiding device can be glass.

Next, an optical layer 46 can be formed on the second insulating layer 363 of the abovementioned optoelectronic device and cover each of the optoelectronic units U, the first contact optoelectronic unit U1, and the second contact optoelectronic unit U2. A material of the optical layer 46 can include a mixture mixing a high reflectivity substance with a base, wherein the base can be silicone resin, epoxy resin or other material and the high reflectivity substance can be $TiO_2$.

Figure 5C:
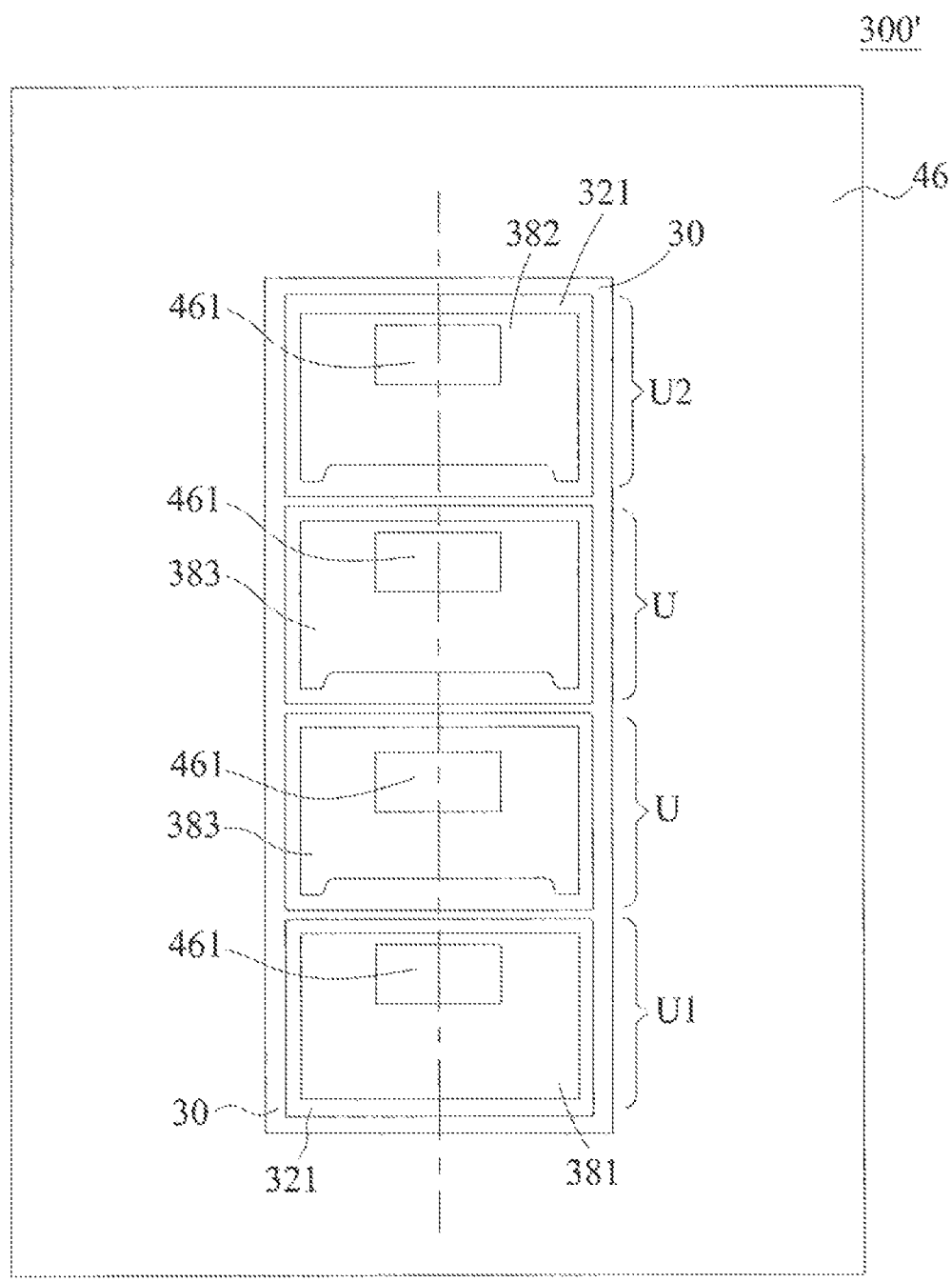
FIG. 5C and FIG. 5D show top views of an optoelectronic device in accordance with one embodiment of the present application.

Afterwards as shown in FIG. 5C, a plurality of openings 461 can be formed on the optical layer 46, corresponding to positions of the third electrode 381 of the first contact optoelectronic unit U1 and the fourth electrode 382 of the second contact optoelectronic unit U2, and expose portions of the third electrode 381 and the fourth electrode 382. In one embodiment, the openings 461 correspond to positions of the first heat dissipation pads 383 of the optoelectronic unit U and expose portions of the first heat dissipation pads 383.

Figure 5D:
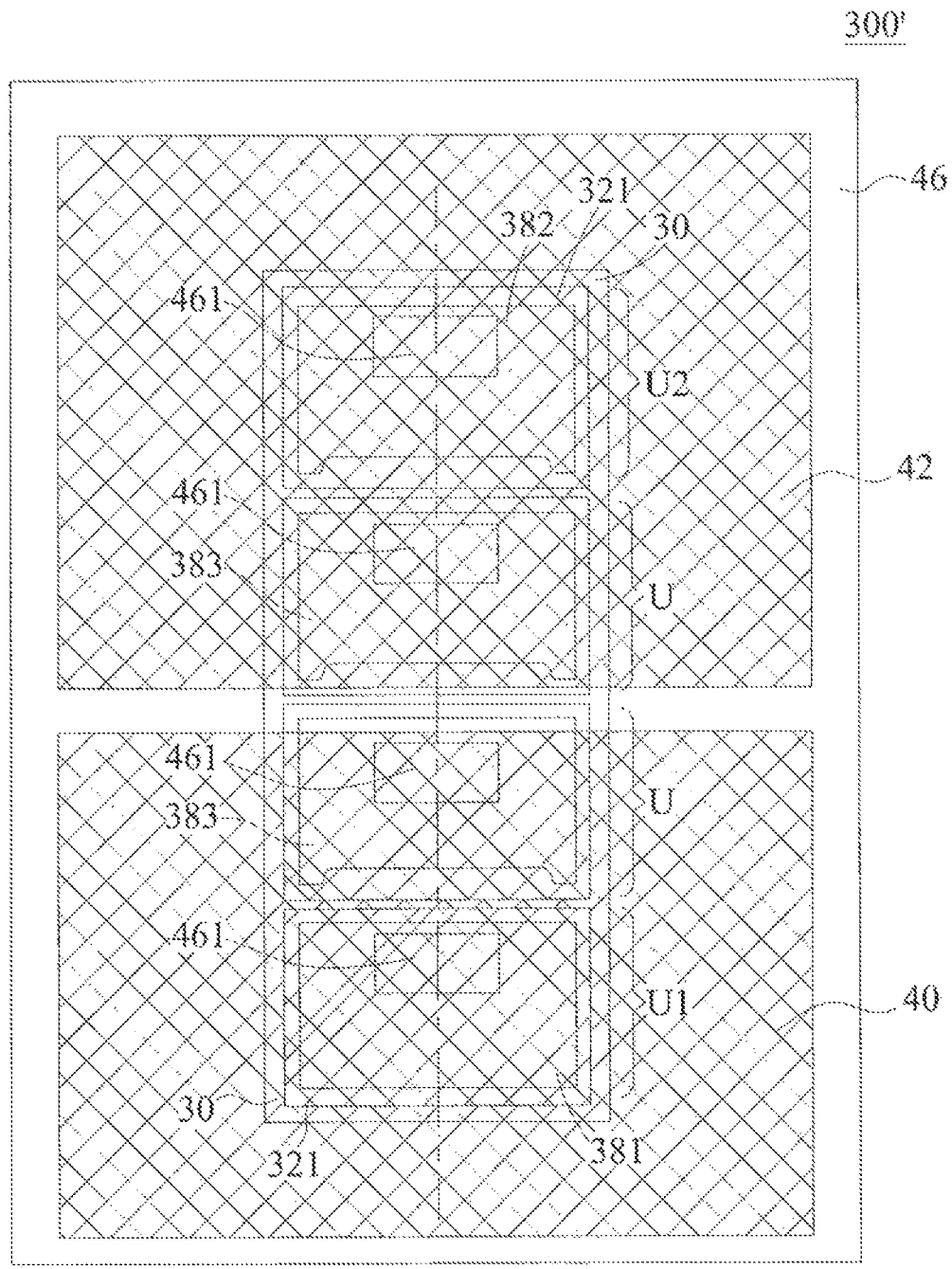
Figure 5E:
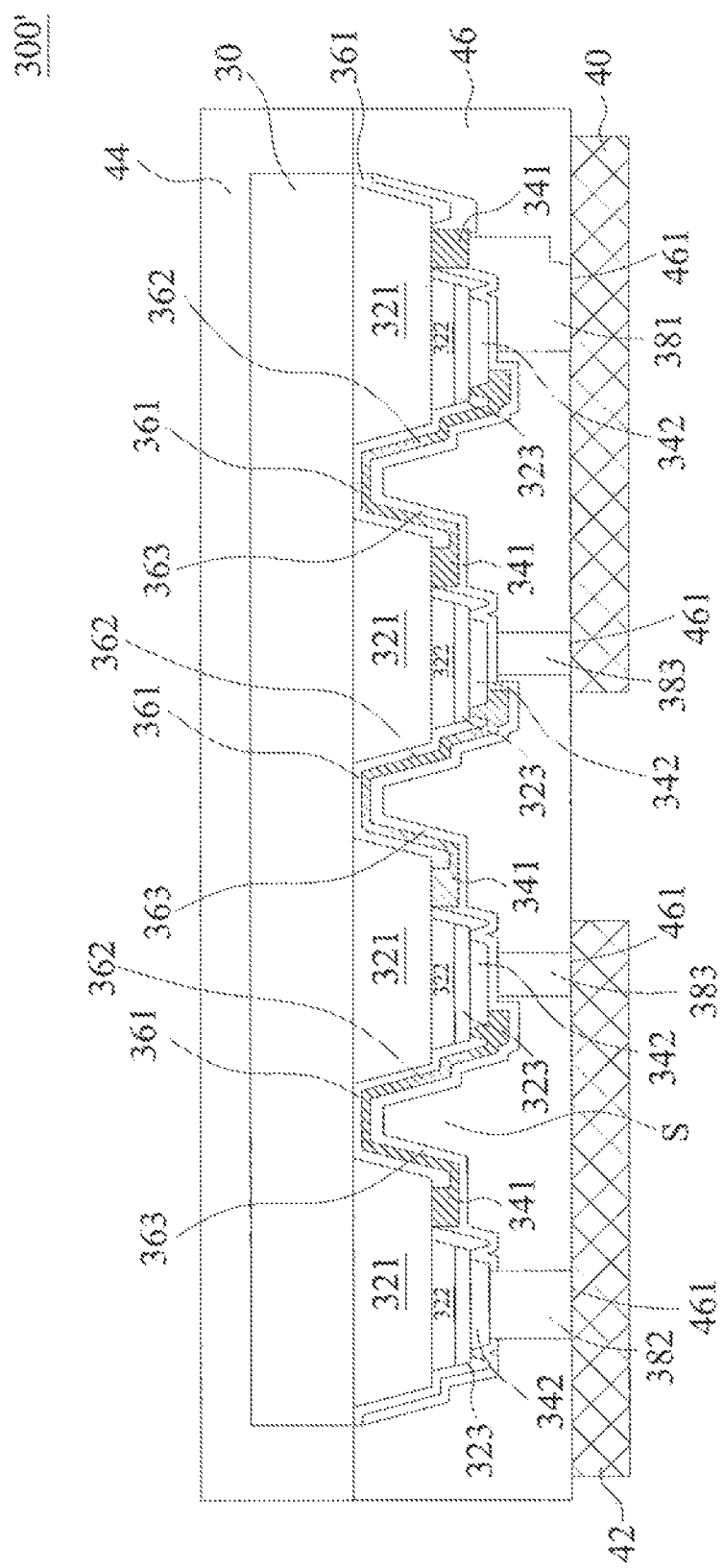
FIG. 5E to FIG. 5F show side views of an optoelectronic device in accordance with one embodiment of the present application.

Next, as shown FIG. 5D and FIG. 5E, a fifth electrode 40 and a sixth electrode 42 are formed and electrically connected with the third electrode 381 and the fourth electrode 382 respectively. In one embodiment, the fifth electrode 40 and sixth electrode 42 can be optionally electrically connected with one of the first heat dissipation pads 383 for dissipating heat. In one embodiment, the fifth electrode 40 or the sixth electrode 42 includes a metal reflection layer. In one embodiment, the optical layer 46 is between the third electrode 381 and the fifth electrode 40 and between the fourth electrode 382 and the sixth electrode 42. In one embodiment, an outer boundary of the optical layer 46 is greater than an outer boundary of the substrate 30.

Figure 5F:
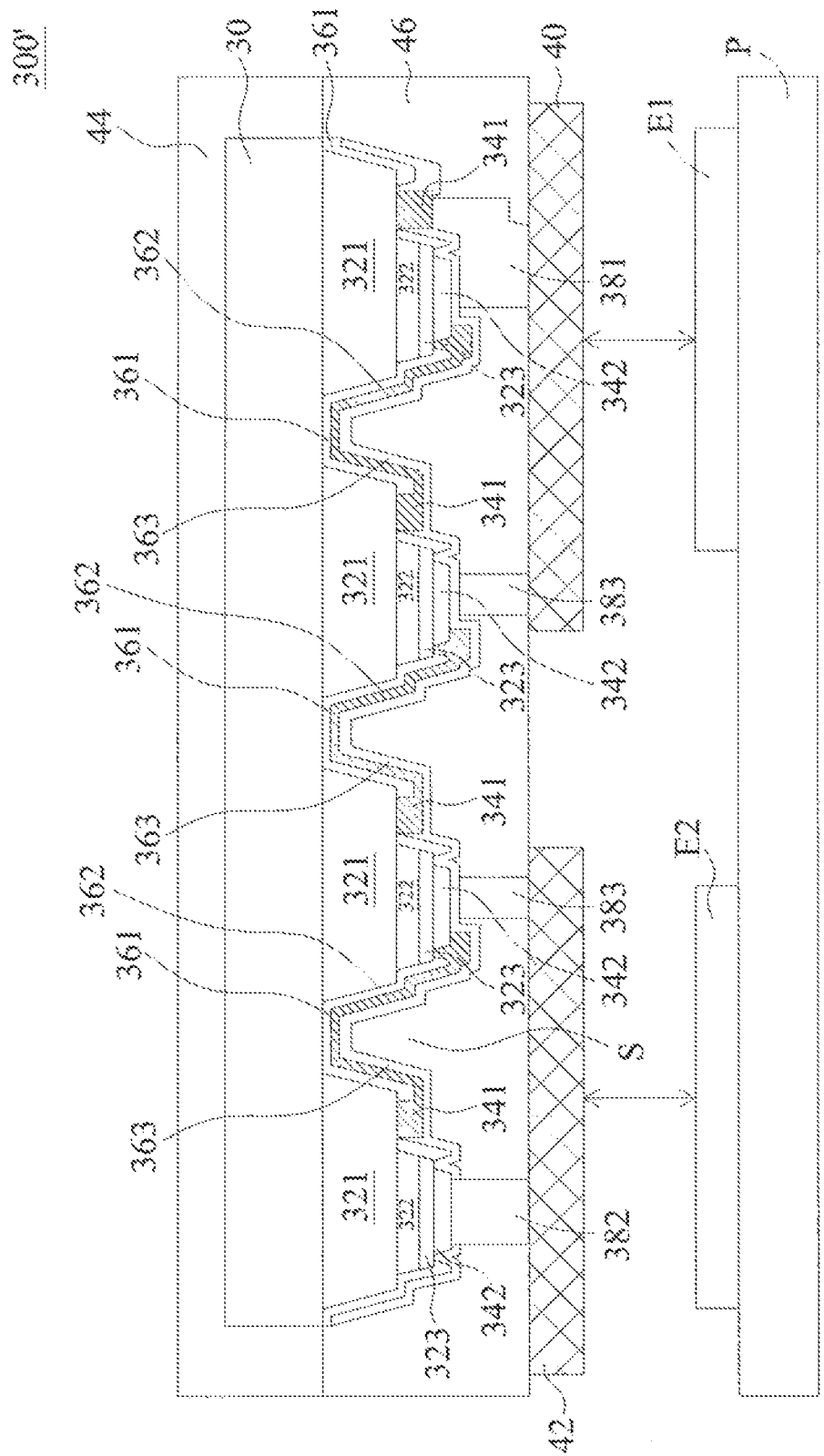

Finally, as shown in FIG. 5F, a carrier plate or a circuit device P is provided and a first carrier electrode E1 and a second carrier electrode E2 are formed on the carrier plate or the circuit device P by wiring or soldering. The first carrier electrode E1 and the second carrier electrode E2 can form a flip chip structure with the fifth electrode 40 and the sixth electrode 42 of the optoelectronic device 300'. In one embodiment, the outer boundaries of the fifth electrode 40 and the sixth electrode 42 go beyond the outer boundary of the substrate 30. In one embodiment, the projection areas of the fifth electrode 40 and the sixth electrode 42, vertical to a surface of the substrate 30, are greater than an area of the substrate 30. By enlarging the areas of the fifth electrode 40 and the sixth electrode 42, it is more convenient for a subsequent connection with the carrier plate or the circuit device P so as to reduce misalignment.

Figure 6A:
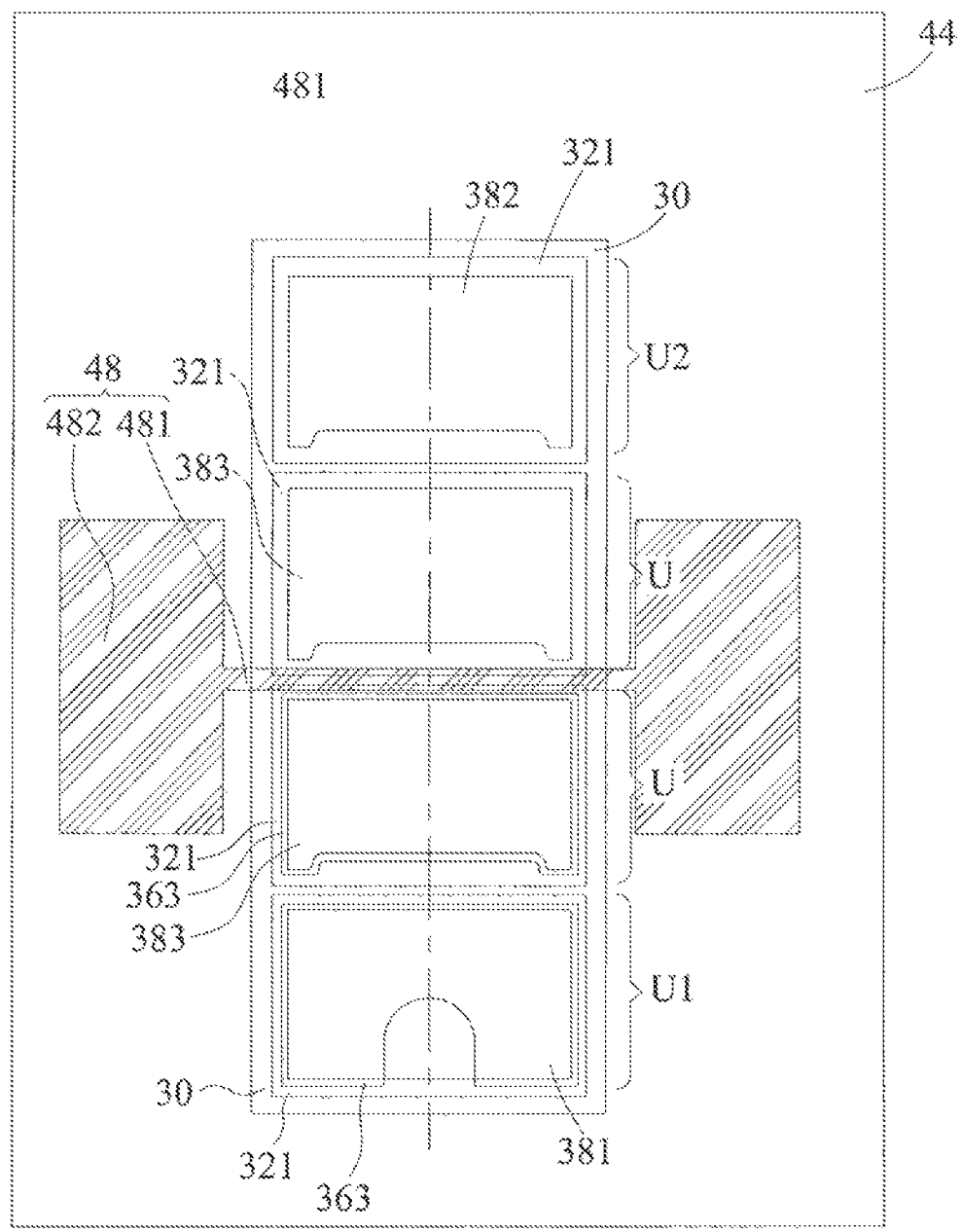
FIG. 6A shows a top view of an optoelectronic device in accordance with one embodiment of the present application.
Figure 6B:
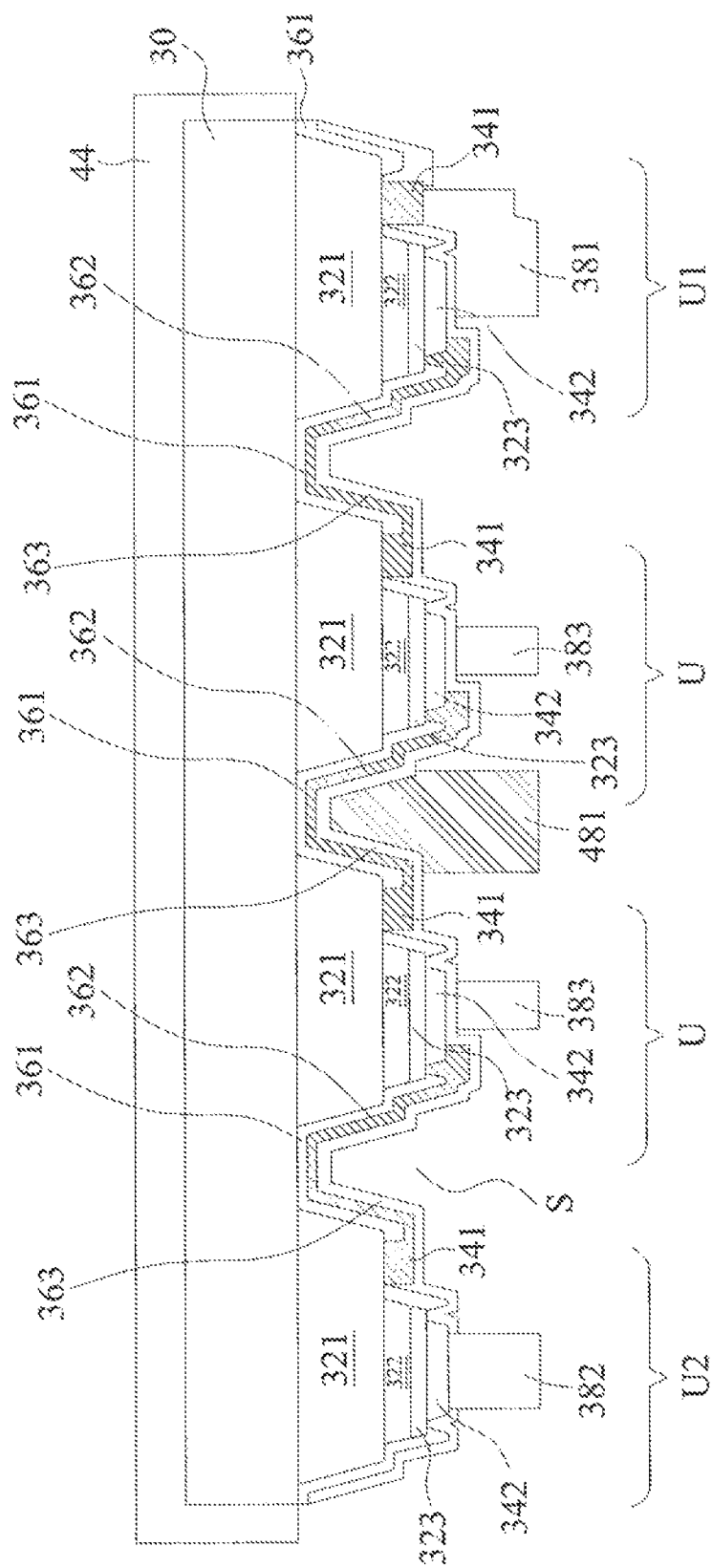
FIG. 6B show a side view of an optoelectronic device in accordance with one embodiment of the present application.

FIG. 6A through FIG. 6F shows side views and top views of a manufacturing process in accordance with a third embodiment of the present application. FIG. 6A and FIG. 6B are subsequent to steps shown in FIG. 5A and FIG. 5B. The manufacturing method, the materials, and the labels of the present embodiment are the same as that of the first embodiment, and those are omitted herein. In the top view of the embodiment, for clarifying the differences between the embodiment and the abovementioned embodiment, some elements are omitted herein for concise. One skilled in the art shall adequately understand the descriptions of the present embodiment by referring to the abovementioned embodiment.

As shown in FIG. 6A and FIG. 6B, the present embodiment further includes a supporting device 44 formed on the substrate 30 of the optoelectronic device and cover a side wall of the substrate 30. Next, a second heat dissipation pad 48 is formed on the optoelectronic device and the supporting device 44. In one embodiment, the second heat dissipation pad 48 and the first heat dissipation pad 383 can be formed in the same process or formed in separate processes. In one embodiment, a material of the second heat dissipation pad 48 can be the same as the material of the first heat dissipation pad 383. In one embodiment, a material of the second heat dissipation pad 48 can be a material with thermal conductivity >50 W/mK or an insulating material, for example, metal or diamond-like carbon.

In one embodiment, the second heat dissipation pad 48 includes two first portions 482 formed on the supporting device 44 and a second portion 481 formed on the abovementioned optoelectronic device, and two ends of the second portions 481 are connected with the two first portions 482 to form a dumbbell shape. In one embodiment, a width of the first portion 482 is greater than a width of the second portion 481.

In one embodiment, the second heat dissipation pad 48 is formed between two of the optoelectronic units U, does not directly contact, and is not electrically connected with the first heat dissipation pad 383. In one embodiment, the second heat dissipation pad 48 is formed on the second insulating layer 363 between two of the optoelectronic units U.

Figure 6C:
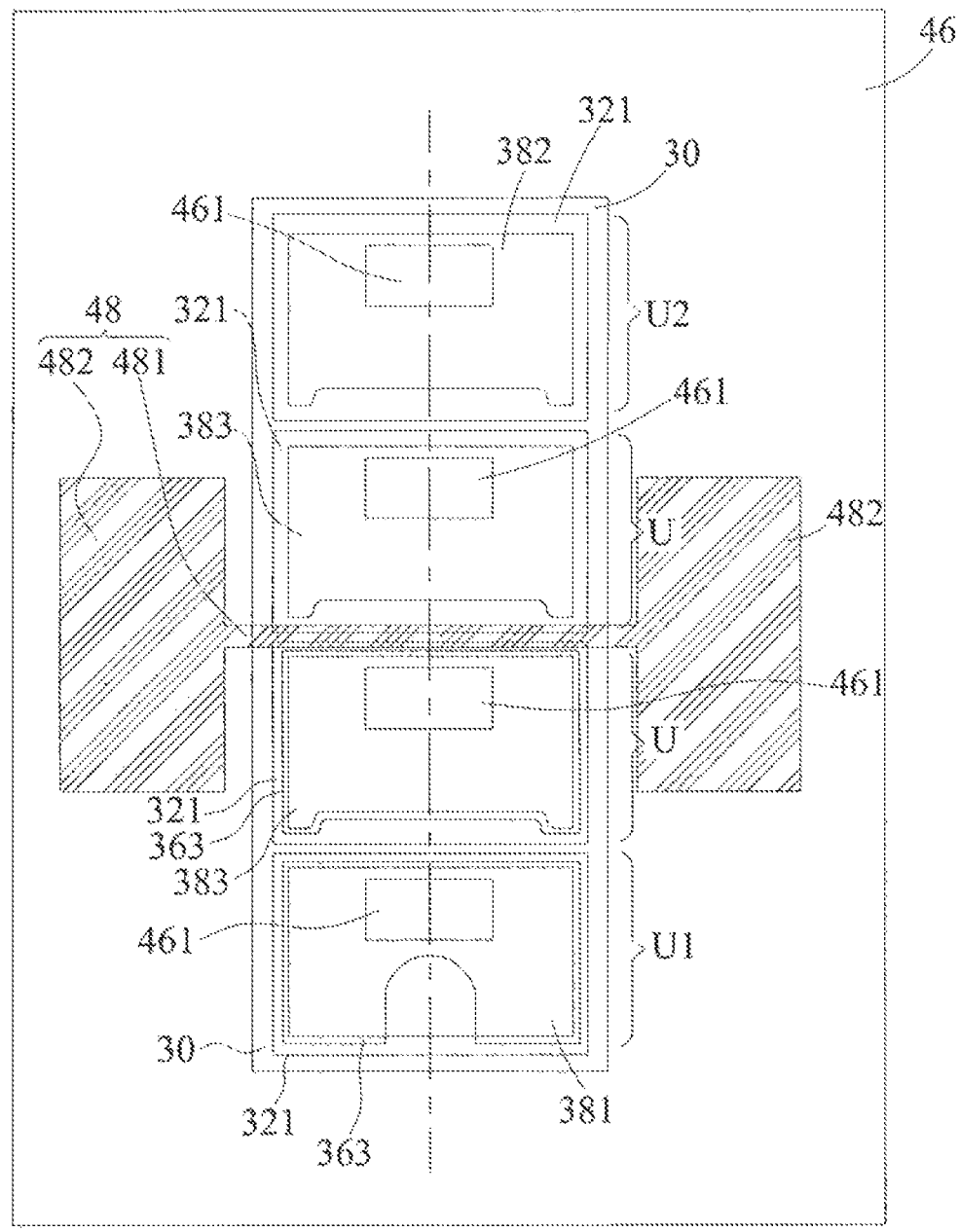
FIG. 6C show a top view of an optoelectronic device in accordance with one embodiment of the present application.
Figure 6D:
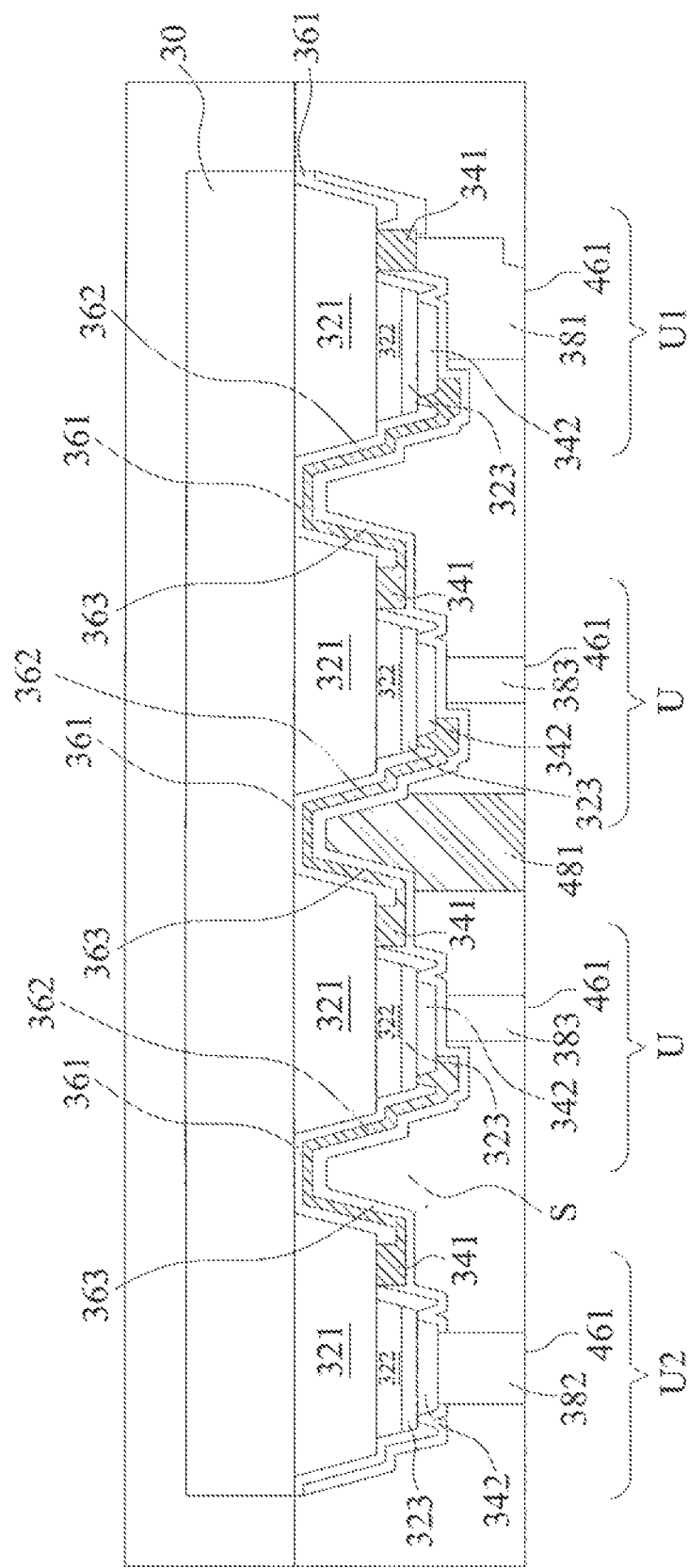
FIG. 6D show a side view of an optoelectronic device in accordance with one embodiment of the present application.

As shown in FIG. 6C and FIG. 6D, an optical layer 46 is formed on the second insulating layer 363 and covers each of the optoelectronic units U, the first contact optoelectronic unit U1, the second contact optoelectronic unit U2, and the second heat dissipation pad 48. A material of the optical layer 46 includes a mixture mixing a high reflectivity substance with a base, wherein the base can be silicone resin, epoxy resin or other material and the high reflectivity substance can be $TiO_2$.

Afterwards, a plurality of openings 461 is formed on the optical layer 46, corresponds positions of the third electrodes 381 of the first contact optoelectronic unit U1 and the fourth electrodes 382 of the second contact optical unit U2, and exposes portions of the third electrodes 381 and the fourth electrodes 382. In one embodiment, the openings 461 correspond to the positions of the first heat dissipation pads 383 of each of the optoelectronic units U and expose portions of the first heat dissipation pads 383.

Figure 6E:
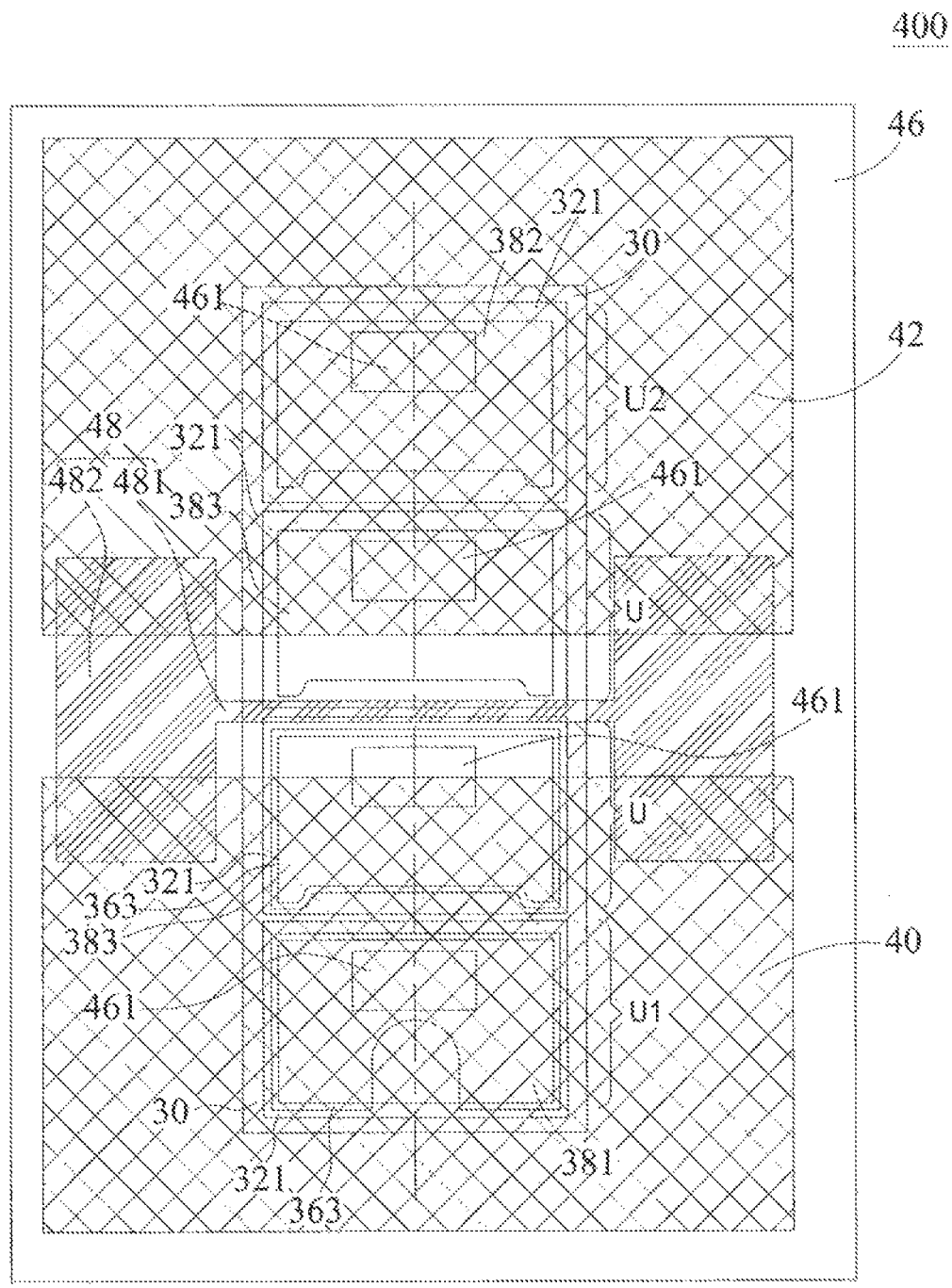
FIG. 6E show a top view of an optoelectronic device in accordance with one embodiment of the present application.
Figure 6F:
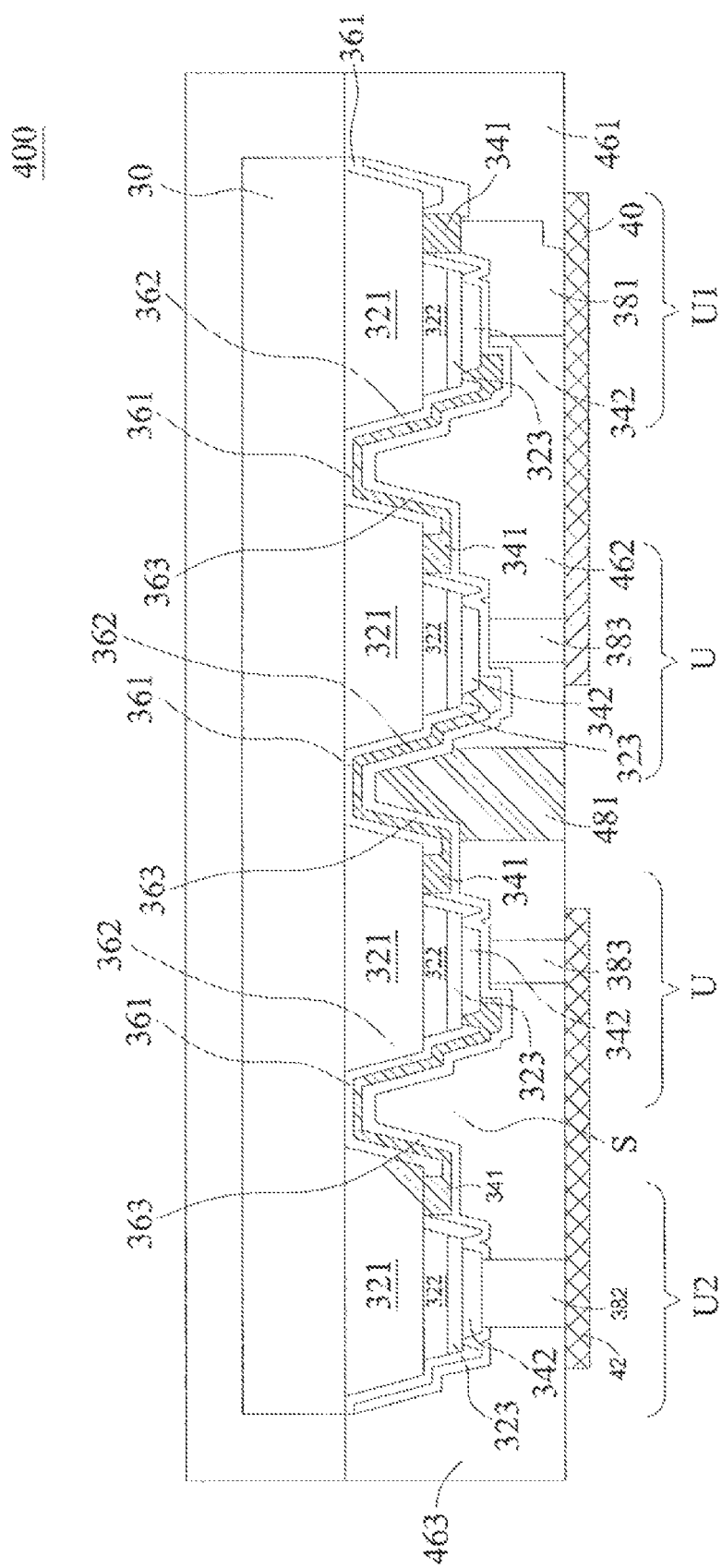
FIG. 6F show a side view of an optoelectronic device in accordance with one embodiment of the present application.

Next, as shown in FIG. 6E and FIG. 6F, a fifth electrode 40 and a sixth electrode 42 are formed and electrically connected with the third electrode 381 and the fourth electrode 382 respectively. In one embodiment, the fifth electrode 40 and the sixth electrode 42 can be optionally connected with one of the first heat dissipation pads 383 and the second heat dissipation pad 48 respectively for dissipating heat and completing the optoelectronic device 400 of the embodiment. In one embodiment, the fifth electrode 40 or the sixth electrode 42 includes a metal reflection layer. In one embodiment, the optical layer 46 is between the third electrode 381 and the fifth electrode 40 and between the fourth electrode 382 and the sixth electrode 42. In one embodiment, an outer boundary of the optical layer 46 is greater than an outer boundary of the substrate 30.

In one embodiment, a carrier plate or a circuit device (not shown in the figures) is provided and a first carrier electrode (not shown in the figures) and a second carrier electrode (not shown in the figures) are formed on the carrier plate or the circuit device by wiring or soldering. The first carrier electrode and the second carrier electrode E2 can form a flip chip structure with the fifth electrode 40 and the sixth electrode 42 of the optoelectronic device 400. In one embodiment, the outer boundaries of the fifth electrode 40 and the sixth electrode 42 go beyond the outer boundary of the substrate 30. In one embodiment, the projection areas of the fifth electrode 40 and the sixth electrode 42, vertical to a surface of the substrate 30, are greater than an area of the substrate 30. In the embodiment, by enlarging the areas of the fifth electrode 40 and the sixth electrode 42, it is more convenient for a subsequent connection with the carrier plate or the circuit device so as to reduce misalignment.

Figure 7A:
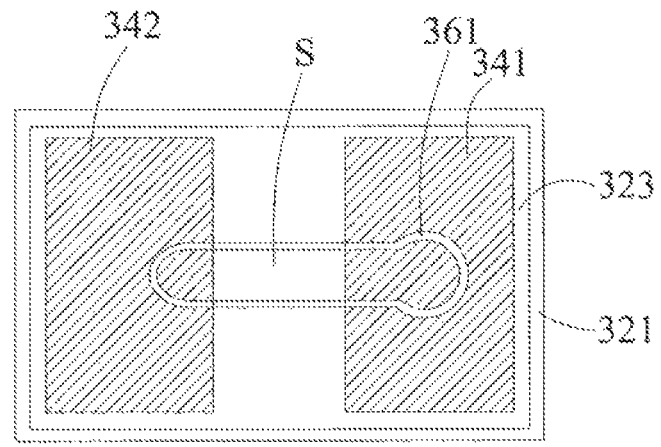
FIG. 7A through FIG. 7D show top views of an optoelectronic device in accordance with another embodiment of the present application.

FIG. 7A through FIG. 7D show a manufacturing process of a fourth embodiment of the present application. As shown in FIG. 7A, the present embodiment includes a substrate (not shown in the figures). The substrate is not limited to be made of a single material, but can be a composite substrate composed of a plurality of different materials. For example, the substrate can include a first substrate and a second substrate jointed with each other (no shown in the figures).

Subsequently, in a conventional epitaxial growth process, an epitaxial stack is formed and includes a first semiconductor layer 321, an active layer (not shown in the figures), and a semiconductor layer 323. Next, a trench S is formed and exposes a portion of the first semiconductor layer 32, and a first insulating layer 361 is formed on a side wall of the trench S to electrically insulate from the active layer and the second semiconductor layer 323. In one embodiment, a metal layer is disposed in the trench S to form a first extension electrode (not shown in the figures). Afterwards, a first electrode 341 is formed on the first extension electrode, and a second electrode 342 is formed on the second semiconductor layer 323. In one embodiment, the first electrode 341 or the second electrode 342 can be a stacked structure and/or include a metal reflection layer with reflectivity (not show in the figures) of more than 80%.

Figure 7B:
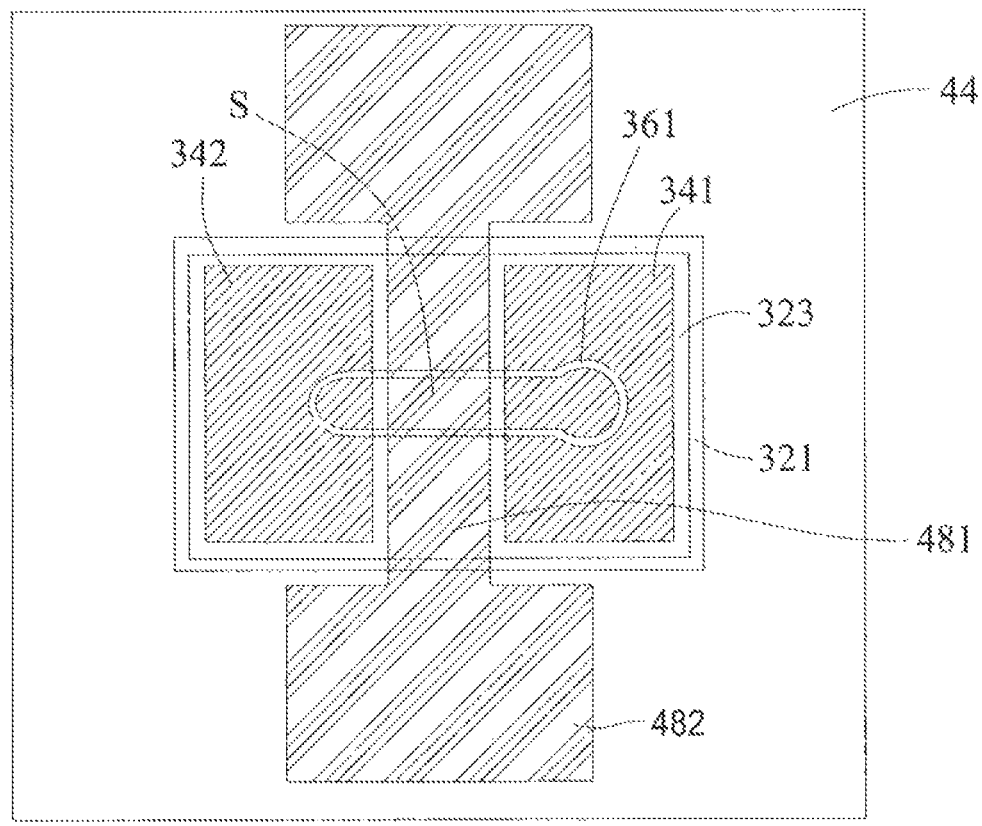
Figure 7C:
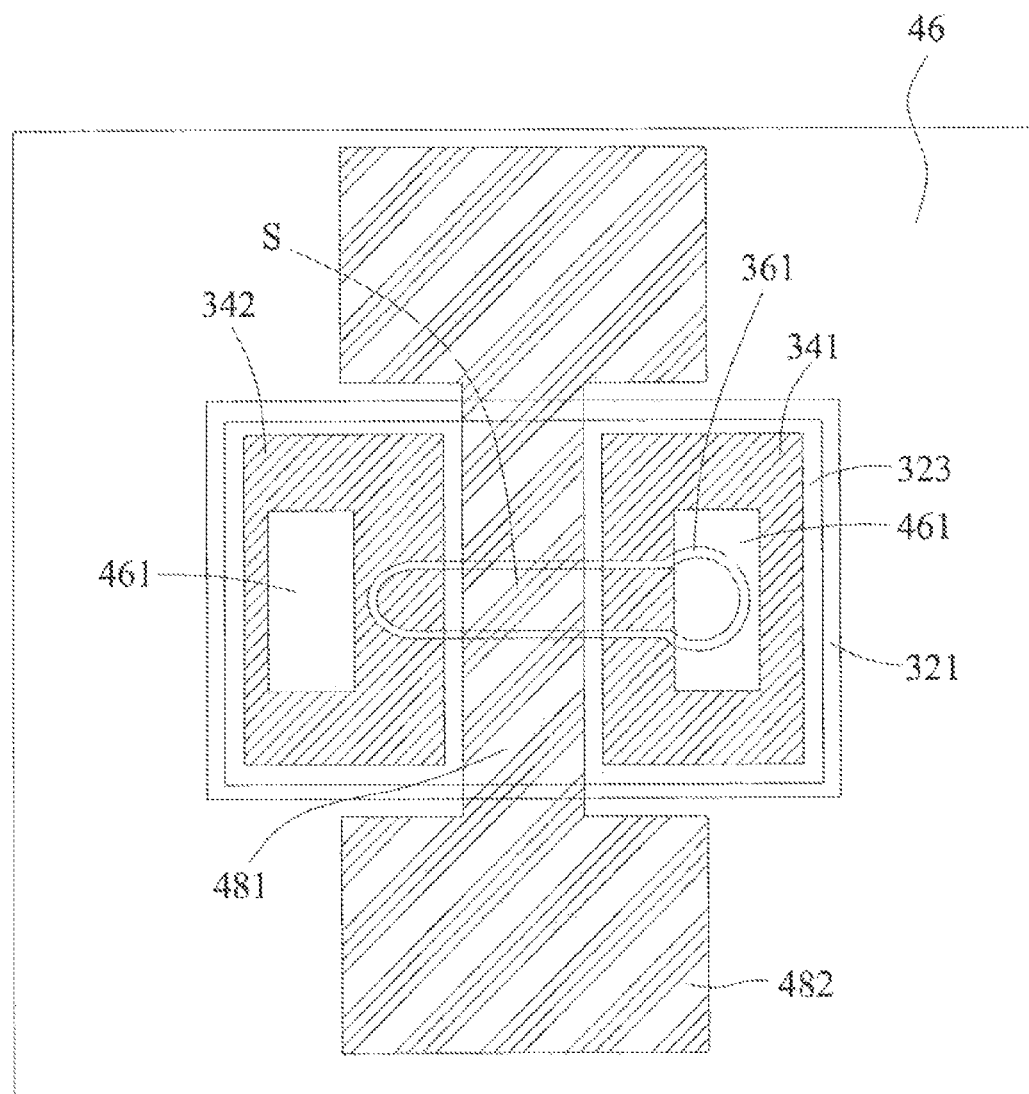

Afterwards, as shown in FIG. 7B, a supporting device 44 is formed on the substrate and cover a side wall of the substrate. In one embodiment, the supporting device 44 can be transparent and a material of the supporting device 44 can be silicone resin, epoxy resin, or other material. In one embodiment, a light guiding device (not shown in the figures) can be formed on the supporting device 44. In one embodiment, a material of the light guiding device can be glass. Subsequently, a second heat dissipation pad 48 is formed on the optoelectronic device and the supporting device 44. A material of the second heat dissipation pad 48 can have a thermal conductivity >50 W/mK, for example, metal; a material of the second heat dissipation pad 48 can be an insulating material, for example, diamond-like carbon or diamond.

In one embodiment, the second heat dissipation 48 includes two first portions 482 formed on the supporting device 44 and a second portion 481 formed on the abovementioned optoelectronic device, and two ends of the second portions 481 are connected with the two first portions 482 to form a dumbbell shape. In one embodiment, a width of the first portion 482 is greater than a width of the second portion 481.

In one embodiment, the second heat dissipation pad 48 is formed between the first electrode 341 and the second electrode 342, does not directly contact, and is not electrically connected with the first electrode 341 or the second electrode 342.

Next, an optical layer 46 can be formed on any one of the abovementioned optical devices and cover the second heat dissipation pad 48, the first electrode 341, and the second electrode 342. A material of the optical layer 46 can include a mixture mixing a high reflectivity substance with a base, wherein the base can be silicone resin, epoxy resin or other material and the substance with high reflectivity can be $TiO_2$.

Afterwards, a plurality of openings 461 is formed on the optical layer 46, corresponds positions of the first electrodes 341 and the second electrodes 342, and exposes portions of the first electrodes 341 and the second electrodes 342.

Figure 7D:
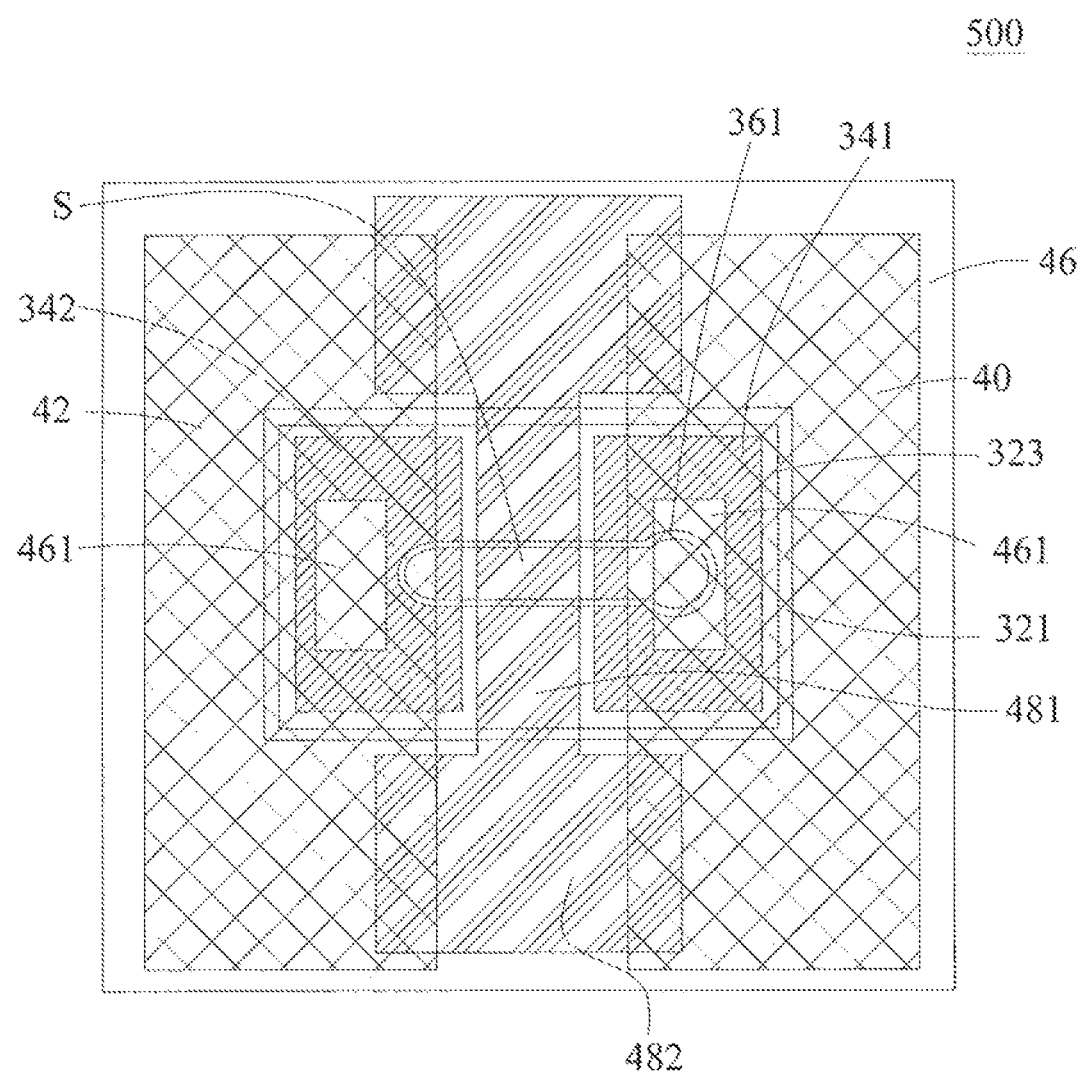

Next, as shown in FIG. 7D, a fifth electrode 40 and a sixth electrode 42 are formed and electrically connected with the first electrode 341 and the second electrode 342 respectively for completing an optoelectronic device 500 of the embodiment. In one embodiment, the fifth electrode 40 and the sixth electrode 42 can be optionally connected with the second heat dissipation pad 48 for dissipating heat. The fifth electrode 40 or the sixth electrode 42 includes a metal reflection layer. The optical layer 46 is between the first electrode 341 and the fifth electrode 40 and between the second electrode 342 and the sixth electrode 42. In one embodiment, an outer boundary of the optical layer 46 is greater than an outer boundary of the substrate.

In one embodiment, a carrier plate or a circuit device (not shown in the figures) is provided and a first carrier electrode (not shown in the figures) and a second carrier electrode (not shown in the figures) are formed on the carrier plate or the circuit device by wiring or soldering. The first carrier electrode and the second carrier electrode E2 can form a flip chip structure with the fifth electrode 40 and the sixth electrode 42 of the optoelectronic device 500. In one embodiment, the outer boundaries of the fifth electrode 40 and the sixth electrode 42 go beyond the outer boundary of the substrate. In one embodiment, the projection areas of the fifth electrode 40 and the sixth electrode 42, vertical to a surface of the substrate, are greater than an area of the substrate. By enlarging the areas of the fifth electrode 40 and the sixth electrode 42, it is more convenient for a subsequent connection with the carrier plate or the circuit device so as to reduce misalignment.

Figure 8A:
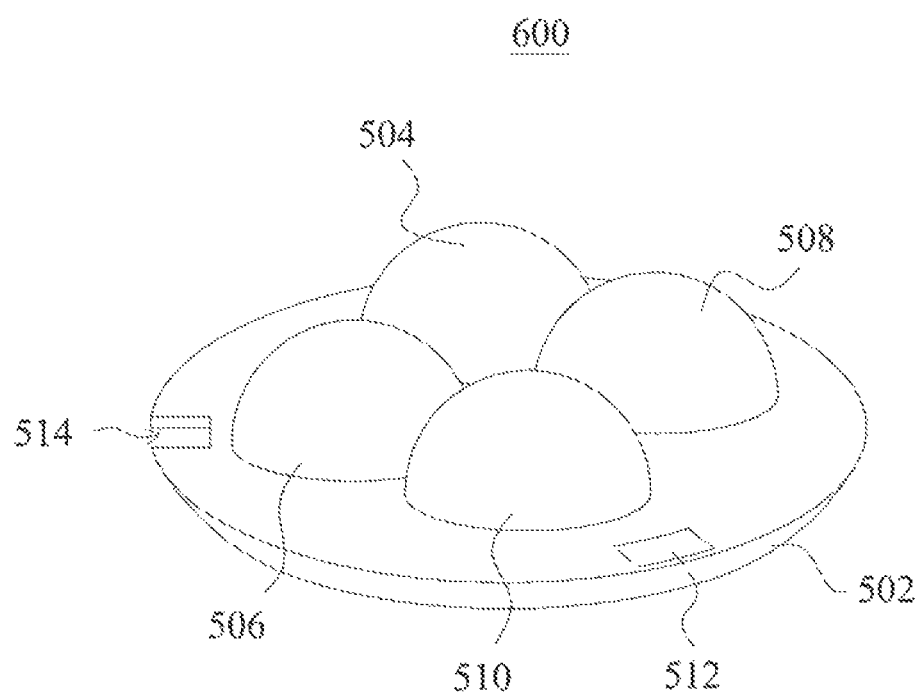
FIG. 8A through FIG. 8C show a light emitting module.
Figure 8B:
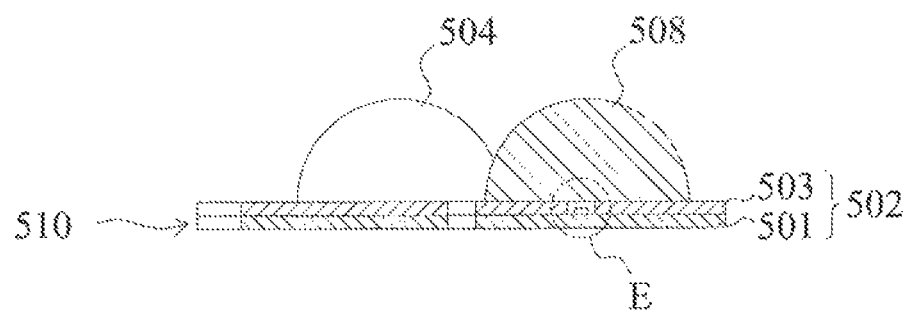
Figure 8C:
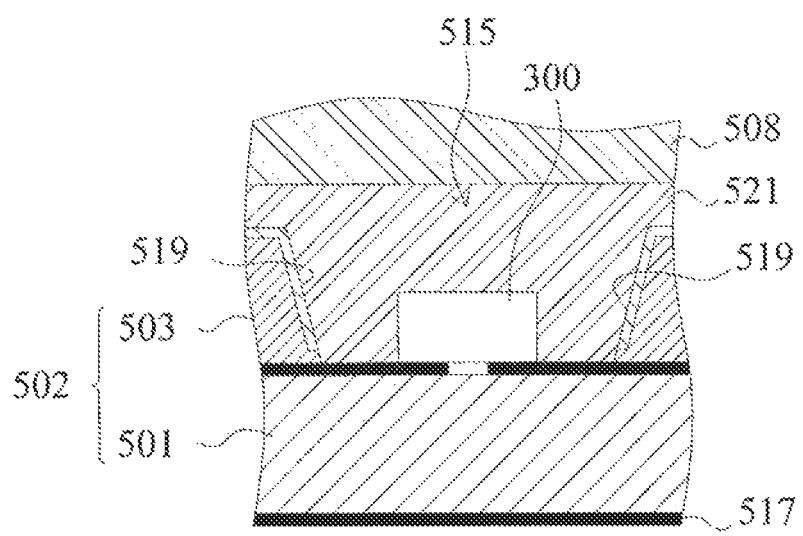

FIG. 8A through FIG. 8C shows a light emitting module. FIG. 8A shows an outer perspective view of the light emitting module. The light emitting module can include a carrier 502, an optoelectronic device (not shown in the figures), a plurality of lens 504, 506, 508, and 510, and two power supply terminations 512 and 514. The light emitting module 500 can be electrically connected with a light emitting unit 540 mentioned below.

FIG. 8B and FIG. 8C show cross-sectional view of a light-emitting module 600 wherein FIG. 8C is a detailed view of a region E of FIG. 8B. The carrier 502 can include an upper carrier 503 and lower carrier 501 wherein a surface of the lower carrier 501 contacts the upper carrier 503. The lenses 504 and 508 are formed on the upper carrier 503. The upper carrier 503 can form one through hole 515 and the optoelectronic device disclosed in the embodiments or an optoelectronic device of other embodiments not shown in the figures can be formed in the through hole 515, contact the lower carrier 501, and be surrounded by a glue 521. The lens 508 is on the glue material 521, and a material of the glue 521 can be silicone resin, epoxy resin or other material. In one embodiment, a reflection layer can be formed on two side walls of the through hole 515 for increasing light efficiency; a metal layer 517 can be formed on a lower surface of the lower carrier 501 for increasing heat dissipation rate.

Figure 9A:
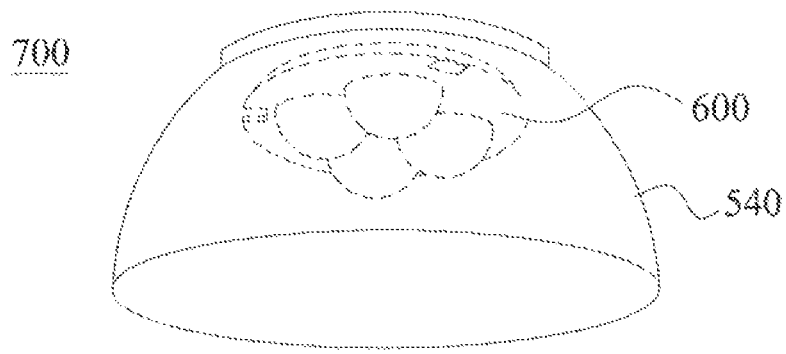
FIG. 9A and FIG. 9B show schematic views of a light generation apparatus.
Figure 9B:
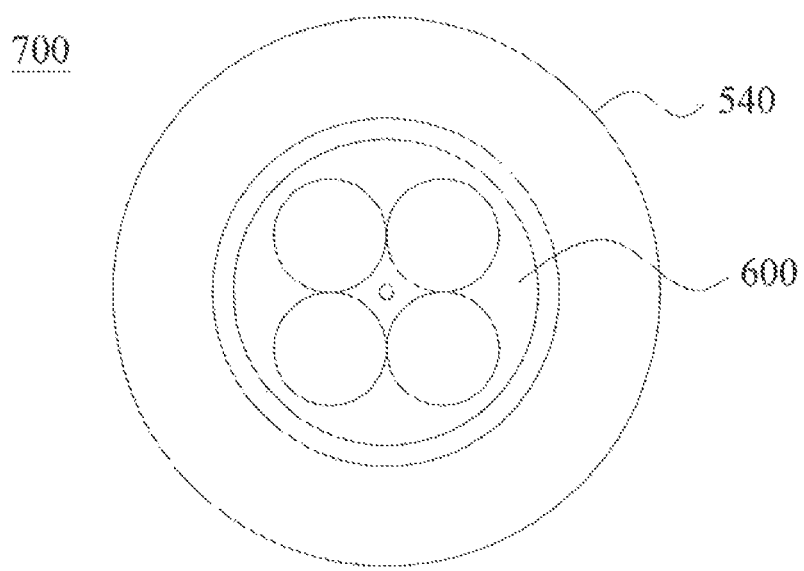

FIG. 9A and FIG. 9B show a light generation apparatus 700. The light generation apparatus 700 includes a light emitting module 600, a light emitting unit 540, a power supply system (not shown in the figures) to supply a current to the light emitting module 600, and a control device (not shown in the figures) to control the power supply system (not shown in the figures). The light generation apparatus 700 can be an illuminous apparatus, for example, a road light, a car light, and an indoor light source, a traffic light, or a backlight of a backlight module of a display.

Figure 10:
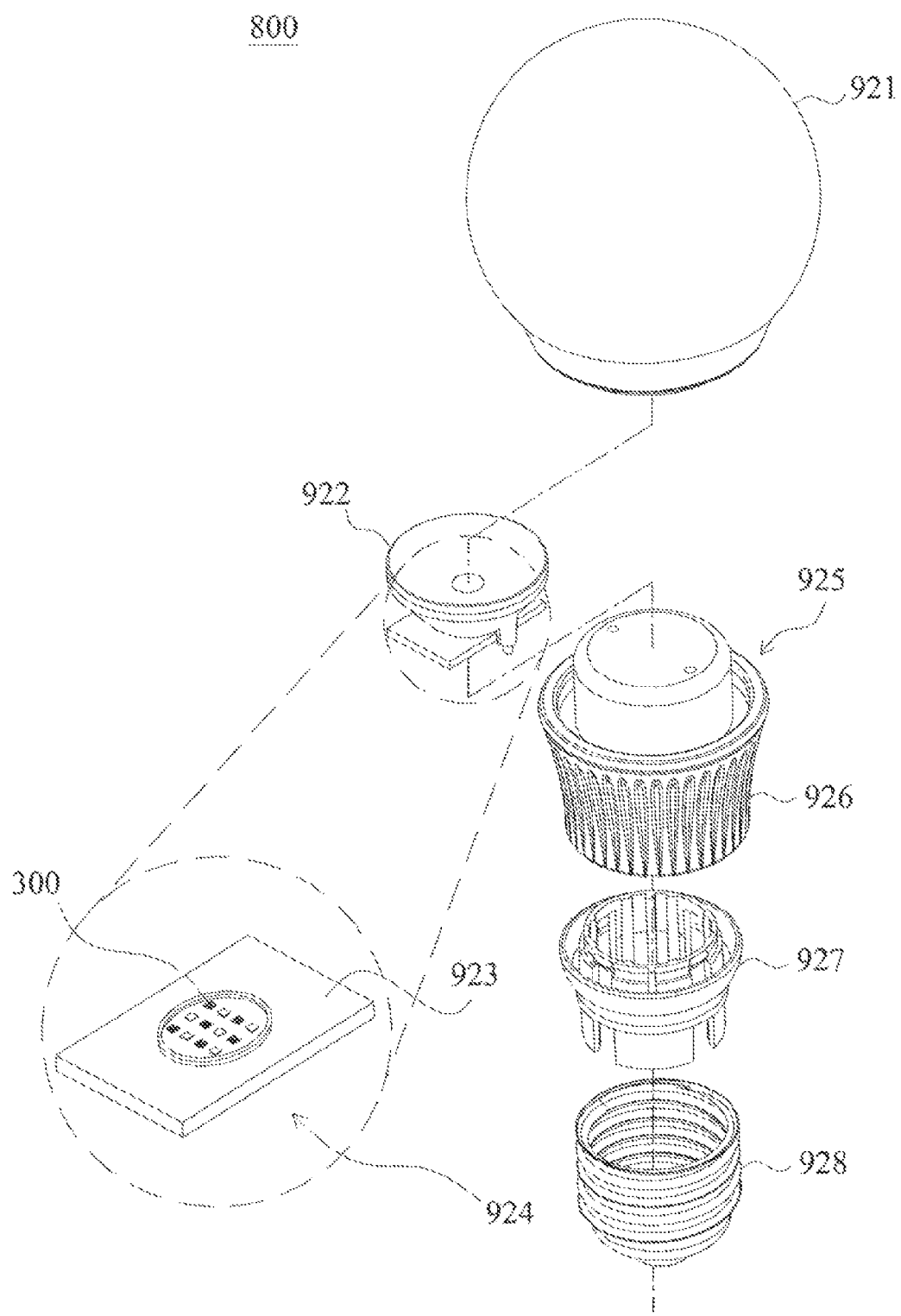
FIG. 10 shows a schematic view of a light bulb.

FIG. 10 shows a light bulb. The light bulb 800 includes a shell 921, a lens 922, an illuminous module 922, a frame 925, a heat dissipater 926, a cascaded portion 927, and an electrical cascaded member 928. Herein the light emitting module 924 includes a carrier 923, and the carrier 923 includes one of the optoelectronic devices 300 of the aforementioned embodiments and an optoelectronic device of other embodiment (not shown in the figures).

Specifically, the substrate 30 is a base for growth or bearing. The substrate 30 can be a conductive substrate or non-conductive substrate, a light-transmitting substrate or a non-transmitting substrate. Herein a material of the conductive substrate can be Ge, GaAs, InP, SiC, Si, $LiAlO_2$, ZnO, GaN, AlN or metal. A material of the light-transmitting substrate can be Sapphire, $LiAlO_2$, ZnO, GaN, glass, diamond, CVD diamond, diamond-like carbon, spinel ($MgAl_2O_4$), $Al_2O_3$, $SiO_x$, and $LiGaO_2$.

An epitaxial stack includes a first semiconductor layer 321, an active layer 322, and a second semiconductor layer 323. The first semiconductor layer 321 and the second semiconductor layer 323, for example, are cladding layers or confinement layers with a single structure, or a stacked structure. The first semiconductor layer 331 and the second semiconductor layer 323 are with different conductivities, different polarities, or different dopants. The conductivities can be a combination of at least two of p type, n type or i type for supplying electrons and holes respectively so that electrons and holes are combined in the active layer 22 to emit light. Materials of the first semiconductor layer 322, the active layer 322, and the second semiconductor layer 323 can include III-V semiconductor materials, for example, $Al_xIn_yGa_{(1-x-y)}N$ or $Al_xIn_yGa_{(1-x-y)}P$ wherein $0 \leq x$, $y \leq 1$ and $(x+y) \leq 1$. According to a material of the active layer 322, the epitaxial stack can emit red light having a wavelength range of 610-650 nm, green light having a wavelength range of 530-570 nm, blue light having a wavelength range of 450-490 or ultraviolet light having a wavelength small than 400 nm.

In another embodiment, the optoelectronic devices 300, 300', 400, and 500 can be an epitaxial device or a light emitting diode and their spectrums can be adjusted by altering physical or chemical constituents of their single layer semiconductor or multi-layer semiconductor. A material of the single layer semiconductor or the multi-layer semiconductor is composed of elements selected from a group consisting of Al, Ga, In, P, N, Zn, and O. A structure of the active layer 322 can be a single heterostructure (SH), a double heterostructure (DH), a double-side double heterostructure (DDH), a multi-quantum well (MQW). Moreover, a number of multi-quantum wells of the active layer 322 can change the wavelength of light.

In one embodiment, a buffer layer (not shown in the figures) can be optionally formed between the first semiconductor 321 and the substrate 30. The buffer layer is between two kinds of material systems for transferring the material system of the first semiconductor layer 321 to the material system of the substrate 30. For a structure of a light emitting diode, in one aspect, the buffer layer can reduce mismatch between two different materials. In another aspect, the buffer layer can combine two kinds of materials or two of separate single layers, stacked layers, or structures. A material of the buffer layer can be an organic material, an inorganic material, metal and a semiconductor, and a structure of the buffer layer can be a reflection layer, a heat conductive layer, an ohmic contact layer, an anti-deformation layer, a stress release layer, a stress adjustment layer, a boding layer, a wavelength conversion layer, and a mechanical fixing structure. In one embodiment, a material of the buffer layer can be selected from aluminum nitride or gallium nitride, and the buffer layer can be formed by sputtering or atomic layer deposition (ALD).

A contact layer can be optionally formed on the second semiconductor layer 323. The contact layer is disposed on a side of the second semiconductor layer 323 and distanced away from the active layer 322. Specifically, the contact layer can be an optical layer, an electronic layer, or a combination thereof. The optical layer can change electromagnetic radiation rays or light emitting from or entering the active layer. The called "change" means at least one of optical characteristics of electromagnetic radiation rays or light is changed. The characteristics include, but are not limited to frequency, wavelength, intensity, flux, efficiency, color temperature, rendering index, light field, and angle of view. The electronic layer can change or make a trend of change in values, intensities, and distributions of at least one of voltages, resistors, currents, and capacities of opposite sides of the contact layer. A material of the contact layer includes oxide, conductive oxide, transparent oxide, oxide with transmittance of more than 50%, metal, a relative light-transmitting metal, metal with transmittance of more than 50%, an organic substance, an inorganic substance, a fluorescence substance, a phosphorescence substance, ceramic, a semiconductor, a doped semiconductor, and an undoped semiconductor. In some applications, a material of the contact layer can be indium tin oxide (ITO), cadmium tin oxide (CTO), antimony tin oxide (ATO), aluminum zinc oxide (AZO), and zinc tin oxide (ZTO). If the material is a relative light-transmitting metal, the preferred thickness is about 0.005 µm~0.6 µm.

The principle and the efficiency of the present application illustrated by the embodiments above are not the limitation of the present application. Any person having ordinary skill in the art can modify or change the aforementioned embodiments. Therefore, the protection range of the rights in the present application will be listed as the following claims.

What is claimed is:

1. An optoelectronic device, comprising:
a substrate having a first side, a second side opposite to the first side, and a first outer boundary;
a first contact optoelectronic unit formed on the first side of the substrate;
a second contact optoelectronic unit formed on the first side of the substrate;
an optoelectronic unit formed on the first side of the substrate;
a first electrode formed on and electrically connected to the first contact optoelectronic unit;
a second electrode formed on and electrically connected to the second contact optoelectronic unit;
a heat dissipation pad formed between the first electrode and the second electrode, wherein the heat dissipation pad is formed on and electrically insulated from the optoelectronic unit; and
a plurality of conductor arrangement structures electrically connected to the first contact optoelectronic unit, the second contact optoelectronic unit, and the optoelectronic unit to form an array.

2. The optoelectronic device of claim 1, further comprising a plurality of the optoelectronic units formed on the first side of the substrate.

3. The optoelectronic device of claim 2, wherein conductor arrangement structures are separated from one another and one of the conductor arrangement structures is electrically connected with the first contact optoelectronic unit and one of the optoelectronic units adjacent the first contact optoelectronic unit or electrically connected with the second contact optoelectronic unit and one of the optoelectronic units adjacent the second contact optoelectronic unit or electrically connected with two of the adjacent optoelectronic units.

4. The optoelectronic device of claim 2, further comprising a plurality of the heat dissipation pads correspondingly formed on the optoelectronic units wherein a distance between any two of the heat dissipation pads is greater than 100 µm.

5. The optoelectronic device of claim 2, further comprising a supporting device formed on the second side of the substrate and covering a side wall of the substrate wherein the heat dissipation pad is formed on the supporting device.

6. The optoelectronic device of claim 5, further comprising a trench formed between two adjacent of the first contact optoelectronic unit, the optoelectronic units, and the second contact optoelectronic unit wherein the heat dissipation pad comprises a first portion formed on the supporting device and a second portion formed on the trench.

7. The optoelectronic device of claim 2, further comprising a third electrode formed on the first electrode and electrically connected therewith, and a fourth electrode formed on the second electrode and electrically connected therewith, wherein an outer boundary of the third electrode or the fourth electrode goes beyond the first outer boundary of the substrate.

8. The optoelectronic device of claim 7, further comprising an optical layer between the third electrode and the first electrode and between the fourth electrode and the second electrode, wherein the optical layer has a second outer boundary and the first outer boundary of the substrate is formed in the second outer boundary.

9. The optoelectronic device of claim 1, wherein the heat dissipation pad has a stacked structure the same as that of the first electrode or the second electrode.

10. The optoelectronic device of claim 1, wherein the substrate is an epitaxial growth substrate or a bearing substrate and/or the substrate comprises a wavelength conversion material.

11. The optoelectronic device of claim 1, wherein each of the first contact optoelectronic unit, the second contact optoelectronic unit, and the optoelectronic unit comprises a first semiconductor layer, a second semiconductor layer, and an active layer formed between the first semiconductor layer and the second semiconductor layer.

12. The optoelectronic device of claim 11, further comprising a contact layer or a metal reflection layer formed on the second semiconductor layer of one of the first contact optoelectronic unit, the second contact optoelectronic unit, and the optoelectronic unit.

13. The optoelectronic device of claim 11, wherein the second semiconductor layer of the optoelectronic unit has a first surface area, the heat dissipation pad is formed on the second semiconductor layer of the optoelectronic unit and has a second surface area, and a ratio of the second surface area to the first surface area is between 80% and 100%.

14. The optoelectronic device of claim 1, further comprising a carrier plate comprising a first carrier electrode and a second carrier electrode wherein the first carrier electrode and the first electrode are jointed and the second carrier electrode and the second electrode are jointed to form a flip chip structure.

15. The optoelectronic device of claim 1, further comprising a first insulating layer and/or a second insulating layer, wherein the first insulating layer is formed on one of the first contact optoelectronic unit, the second contact optoelectronic unit, and the optoelectronic unit.

16. The optoelectronic device of claim 15, wherein a projection of the heat dissipation pad, vertical to the first side of the substrate, is not formed on the first insulating layer and/or the second insulating layer comprises a flat surface and the heat dissipation pad is formed on the flat surface.

17. The optoelectronic device of claim 15, further comprising a trench formed between the first contact optoelectronic unit and the optoelectronic unit or between the second contact optoelectronic unit and the optoelectronic unit, and portions of the conductor arrangement structures and the first insulating layer stacked disposed in the trench.

18. The optoelectronic device of claim 1, wherein the conductor arrangement structures have a reflectivity of more than 80% for a light emitting from the first contact optoelectronic unit, the second contact optoelectronic unit, or the optoelectronic unit.

19. The optoelectronic device of claim 1, wherein the array is arranged in series.

20. The optoelectronic device of claim 1, further comprising a first extension electrode formed on the first semiconductor layer and electrically connected with the first electrode.

* * * * *